United States Patent
Her et al.

(10) Patent No.: US 11,037,639 B2
(45) Date of Patent: Jun. 15, 2021

(54) MEMORY CONTROLLER AND METHOD OF OPERATING THE SAME FOR PROCESSING THE FAILED READ OPERATION

(71) Applicant: SK hynix Inc., Gyeonggi-do (KR)

(72) Inventors: Min Ho Her, Chungcheongbuk-do (KR); Dong Hyun Kim, Gyeonggi-do (KR); Seung Il Kim, Chungcheongbuk-do (KR); Youn Ho Jung, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 9 days.

(21) Appl. No.: 16/518,313

(22) Filed: Jul. 22, 2019

(65) Prior Publication Data

US 2020/0176066 A1    Jun. 4, 2020

(30) Foreign Application Priority Data

Dec. 3, 2018 (KR) .................. 10-2018-0153630

(51) Int. Cl.
*G11C 16/34* (2006.01)
*G06F 11/07* (2006.01)
*G11C 16/24* (2006.01)
*G11C 16/26* (2006.01)

(52) U.S. Cl.
CPC ........ *G11C 16/3422* (2013.01); *G06F 11/076* (2013.01); *G11C 16/24* (2013.01); *G11C 16/26* (2013.01)

(58) Field of Classification Search
CPC ..... G11C 16/3422; G11C 16/22; G11C 16/26; G06F 11/076

USPC .......... 365/185.21, 185.18, 185.22
See application file for complete search history.

(56) References Cited

U.S. PATENT DOCUMENTS

| | | | | |
|---|---|---|---|---|
| 2009/0049364 A1* | 2/2009 | Jo | ............ | G11C 11/5642 714/763 |
| 2013/0297988 A1* | 11/2013 | Wu | ............ | G06F 11/1068 714/773 |
| 2014/0101519 A1* | 4/2014 | Lee | ............ | G11C 16/26 714/773 |
| 2015/0070988 A1* | 3/2015 | Park | ............ | G06F 11/141 365/185.03 |

FOREIGN PATENT DOCUMENTS

KR   10-2012-0094709   8/2012
KR   10-2017-0024225   3/2017

* cited by examiner

*Primary Examiner* — Connie C Yoha
(74) *Attorney, Agent, or Firm* — IP & T Group LLP

(57) ABSTRACT

Provided herein may be a memory controller and a method of operating the same. The memory controller may include a read operation controller configured to provide a read command to a memory device and receive read data corresponding to the read command, a read fail determiner configured to determine, based on the read data, whether a read operation has passed or failed, and to generate read information including a result of the read operation and information about performance of the read operation and a read fail processor configured to select, based on the read information, one of a read retry operation, among a plurality of read retry operations, to be performed on the selected page and an operation of setting a control time for a bit line coupled to the selected page, and to control the memory device to perform the selected operation.

20 Claims, 18 Drawing Sheets

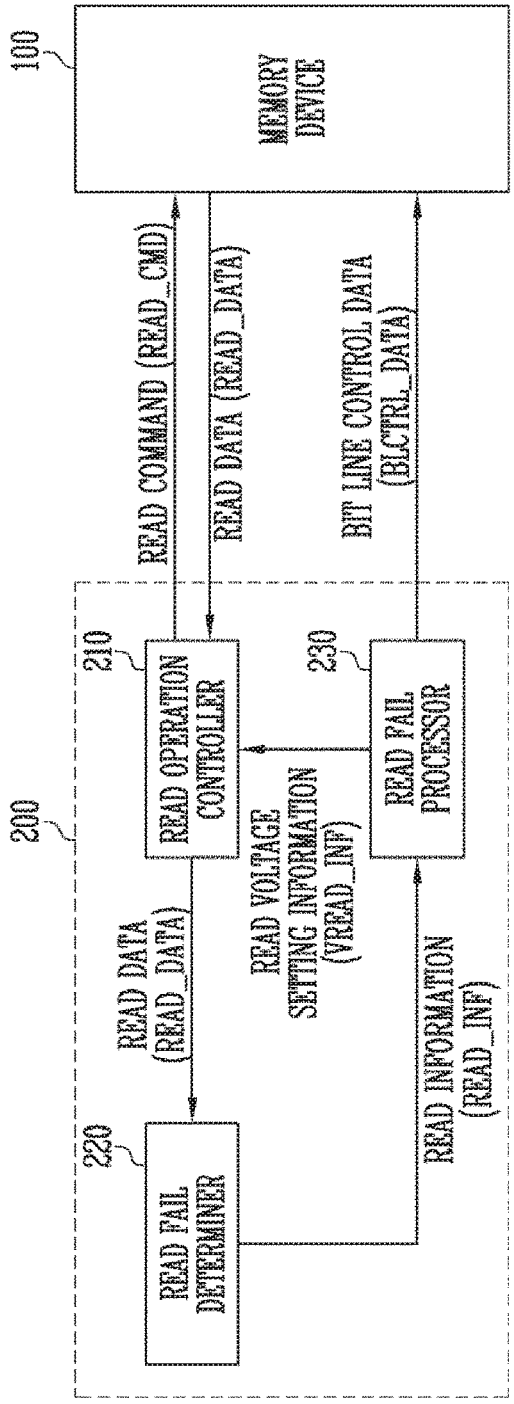
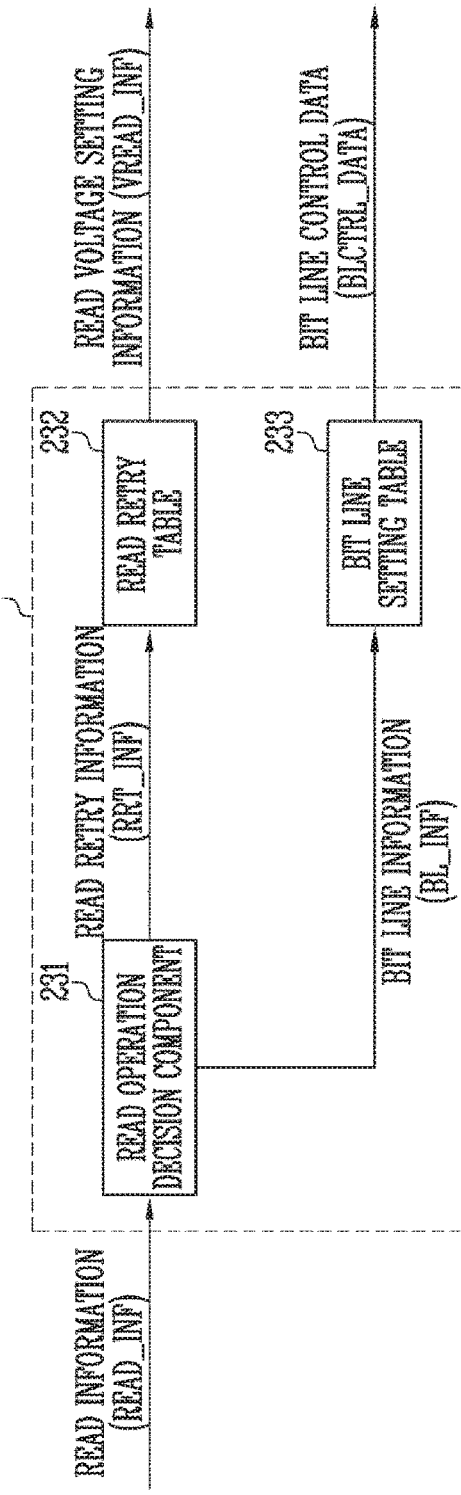

MEMORY CONTROLLER AND METHOD OF OPERATING THE SAME FOR PROCESSING THE FAILED READ OPERATION

CROSS-REFERENCE TO RELATED APPLICATION

The present application claims priority under 35 U.S.C. § 119(a) to Korean patent application number 10-2018-0153630, filed on Dec. 3, 2018, which is incorporated herein by reference in its entirety.

BACKGROUND

Field of Invention

Various embodiments of the present disclosure generally relate to an electronic device, and more particularly, to a memory controller and a method of operating the memory controller.

Description of Related Art

A storage device stores data under the control of a host device such as a computer, a smartphone, or a smartpad. Examples of a storage device include a hard disk drive (HDD) which stores data in a magnetic disk, and a solid state drive (SSD) or a memory card which stores data in a semiconductor memory, particularly, a nonvolatile memory, according to the device in which data is stored.

The storage device may include a memory device in which data is stored and a memory controller which controls the storage of data in the memory device. Such memory device may be a volatile memory or a nonvolatile memory. Representative examples of a nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a memory controller for processing the failure of a read operation and a method of operating the memory controller.

An embodiment of the present disclosure may provide for a memory controller. The memory controller may include a read operation controller configured to, when a read operation is performed on a page selected from among a plurality of pages included in a memory device, provide a read command to the memory device and receive read data corresponding to the read command, a read fail determiner configured to determine, based on the read data, whether the read operation has passed or failed, and to generate read information including a result of the read operation and information about performance of the read operation and a read fail processor configured to select, based on the read information, one of a read retry operation, among a plurality of read retry operations, to be performed on the selected page and an operation of setting a control time for a bit line coupled to the selected page, and to control the memory device to perform the selected operation.

An embodiment of the present disclosure may provide for a memory controller. The memory controller may include a read operation controller configured to, when a read operation is performed on a page selected from among a plurality of pages included in a memory device, provide a read command to the memory device and receive read data corresponding to the read command, a read fail determiner configured to determine, based on the read data, whether the read operation has passed or failed, and to generate read information including a result of the read operation and information about performance of the read operation and a read fail processor configured to select, based on the read information, one of a read retry operation, among a plurality of read retry operations, to be performed on the selected page and an operation of setting a control time for a bit line coupled to the selected page, and to control the memory device to perform the selected operation, wherein the read fail determiner generates the read information in which information indicating failure of the read operation is included in the result of the read operation when an error in the read data falls out of a correctable range, wherein the read fail processor comprises a read retry table configured to include information on a plurality of read retry operations and a bit line setting table configured to include information on the operation of setting the control time for the bit line, wherein the read retry table includes a plurality of pieces of read retry operation information for the plurality of read retry operations, respectively, wherein the read fail processor is configured to perform a read operation on a Most Significant Bit (MSB) logical page in which MSB data is stored, among logical pages in the selected page, and a read operation on a Least Significant Bit (LSB) logical page in which LSB data is stored, among the logical pages, when the result of the read operation indicates failure of the read operation, and when the information about performance of the read operation includes information indicating that all of read retry operations have been performed, wherein the read fail processor is configured to, when the read operation on the MSB logical page has passed and the read operation on the LSB logical page has failed, generate bit line control data for performing the operation of setting the control time for the bit line and wherein the read operation controller sets the control time for the bit line based on the bit line control data, and thereafter provides a read command for performing the read operation to the memory device and receives read data corresponding to the read command.

An embodiment of the present disclosure may provide for a memory controller. The memory controller may include a read operation controller configured to, when a read operation is performed on a page selected from among a plurality of pages included in a memory device, provide a read command to the memory device and receive read data corresponding to the read command, a read fail determiner configured to determine, based on the read data, whether the read operation has passed or failed, and to generate read information including a result of the read operation and information about performance of the read operation and a read fail processor configured to select, based on the read information, one of a read retry operation, among a plurality of read retry operations, to be performed on the selected page and an operation of setting a control time for a bit line coupled to the selected page, and to control the memory device to perform the selected operation, wherein the read fail determiner generates the read information in which information indicating failure of the read operation is included in the result of the read operation when an error in the read data falls out of a correctable range, wherein the read fail processor comprises a read retry table configured to include information on a plurality of read retry operations and a bit line setting table configured to include information on the operation of setting the control time for the bit line, wherein the read retry table includes a plurality of pieces of read retry operation information for the plurality of read retry operations, respectively, wherein the read fail processor is configured to perform a read operation on a Most Significant Bit (MSB) logical page in which MSB data is stored, among logical pages in the selected page, and a read operation on a Least Significant Bit (LSB) logical page in which LSB data is stored, among the logical pages, when the result of the read operation indicates failure of the read operation, and when the information about performance of the read operation includes information indicating that all of read retry operations have been performed, wherein the read fail processor is configured to, when the read operation on the MSB logical page has passed and the read operation on the LSB logical page has failed, generate bit line control data for performing the operation of setting the control time for the bit line and wherein the bit line control data includes data about a time during which the bit line is precharged.

An embodiment of the present disclosure may provide for a memory controller. The memory controller may include a read operation controller configured to, when a read operation is performed on a page selected from among a plurality of pages included in a memory device, provide a read command to the memory device and receive read data corresponding to the read command, a read fail determiner configured to determine, based on the read data, whether the read operation has passed or failed, and to generate read information including a result of the read operation and information about performance of the read operation and a read fail processor configured to select, based on the read information, one of a read retry operation, among a plurality of read retry operations, to be performed on the selected page and an operation of setting a control time for a bit line coupled to the selected page, and to control the memory device to perform the selected operation, wherein the read fail determiner generates the read information in which information indicating failure of the read operation is included in the result of the read operation when an error in the read data falls out of a correctable range, wherein the read fail processor comprises a read retry table configured to include information on a plurality of read retry operations and a bit line setting table configured to include information on the operation of setting the control time for the bit line, wherein the read retry table includes a plurality of pieces of read retry operation information for the plurality of read retry operations, respectively, wherein the read fail processor is configured to perform a read operation on a Most Significant Bit (MSB) logical page in which MSB data is stored, among logical pages in the selected page, and a read operation on a Least Significant Bit (LSB) logical page in which LSB data is stored, among the logical pages, when the result of the read operation indicates failure of the read operation, and when the information about performance of the read operation includes information indicating that all of read retry operations have been performed, wherein the read fail processor is configured to, when the read operation on the MSB logical page has passed and the read operation on the LSB logical page has failed, generate bit line control data for performing the operation of setting the control time for the bit line and wherein the bit line control data includes data about a time during which the bit line is evaluated.

An embodiment of the present disclosure may provide for a method of operating a memory controller. The method may include providing a read command to a memory device when a read operation is performed on a page selected from among a plurality of pages included in the memory device, receiving read data corresponding to the read command, determining, based on the read data, whether the read operation has passed or failed, generating read information including a result of the read operation and information about performance of the read operation and selecting, based on the read information, one of a read retry operation, among a plurality of read retry operations, to be performed on the selected page and an operation of setting a control time for a bit line coupled to the selected page.

An embodiment of the present disclosure may provide for a method of operating a memory controller. The method may include providing a read command to a memory device when a read operation is performed on a page selected from among a plurality of pages included in the memory device, receiving read data corresponding to the read command, determining, based on the read data, whether the read operation has passed or failed, generating read information including a result of the read operation and information about performance of the read operation and selecting, based on the read information, one of a read retry operation, among a plurality of read retry operations, to be performed on the selected page and an operation of setting a control time for a bit line coupled to the selected page, wherein generating the read information comprises generating information indicating failure of the read operation which is included in the result of the read operation when an error included in the read data corresponding to the selected page falls out of a correctable range, wherein the selecting comprises selecting one of a plurality of pieces of read retry operation information and controlling the memory device to perform the read retry operation corresponding to the selected piece of read retry operation information, when the result of the read operation includes the information indicating failure of the read operation, and when the information about performance of the read operation includes information indicating that not all of the read retry operations have been performed, wherein the selecting comprises, performing a read operation on a Most Significant Bit (MSB) logical page in which MSB data is stored, among logical pages in the selected page, and a read operation on a Lease Significant Bit (LSB) logical page in which LSB data is stored, among the logical pages, when the result of the read operation includes the information indicating failure of the read operation, and when the information about performance of the read operation includes information indicating that all of read retry operations have been performed, wherein the selecting comprises: generating, when the read operation on the MSB page has passed and the read operation on the LSB page has failed, bit line control data that allows the memory device to perform the operation of setting the control time for the bit line and wherein the generating of the bit line control data comprises generating data about a time during which the bit line is precharged.

An embodiment of the present disclosure may provide for a method of operating a memory controller. The method may include providing a read command to a memory device when a read operation is performed on a page selected from among a plurality of pages included in the memory device, receiving read data corresponding to the read command, determining, based on the read data, whether the read operation has passed or failed, generating read information including a result of the read operation and information about performance of the read operation and selecting, based on the read information, one of a read retry operation, among a plurality of read retry operations, to be performed on the selected page and an operation of setting a control time for a bit line coupled to the selected page, wherein generating the read information comprises generating information indicating failure of the read operation which is included in the result of the read operation when an error included in the read data corresponding to the selected page falls out of a correctable range, wherein the selecting comprises selecting one of a plurality of pieces of read retry operation information and controlling the memory device to perform the read retry operation corresponding to the selected piece of read retry operation information, when the result of the read operation includes the information indicating failure of the read operation, and when the information about performance of the read operation includes information indicating that not all of the read retry operations have been performed, wherein the selecting comprises, performing a read operation on a Most Significant Bit (MSB) logical page in which MSB data is stored, among logical pages in the selected page, and a read operation on a Lease Significant Bit (LSB) logical page in which LSB data is stored, among the logical pages, when the result of the read operation includes the information indicating failure of the read operation, and when the information about performance of the read operation includes information indicating that all of read retry operations have been performed, wherein the selecting comprises: generating, when the read operation on the MSB page has passed and the read operation on the LSB page has failed, bit line control data that allows the memory device to perform the operation of setting the control time for the bit line and wherein the generating of the bit line control data comprises generating data about a time during which the bit line is evaluated.

An embodiment of the present disclosure may provide for method of operating a storage device. The method may include, when a read operation is performed on a page selected from among a plurality of pages included in a memory device, determining whether the read operation on the selected page has passed or failed and selecting, when the read operation fails, one of a read retry operation on the selected page and a read operation on the selected page performed after a control time for a bit line coupled to the selected page has been set.

An embodiment of the present disclosure may provide for a memory system. The memory system may include a memory device including a least significant bit (LSB) page and a most significant bit (MSB) page, both coupled to bit lines and a controller configured to: control the memory device to perform a first read operation to the LSB and MSB pages; control, when the first read operation fails to the MSB page, the memory device to perform a read retry operation to the MSB page and control, when the first read operation fails to the LSB page, the memory device to perform a second read operation to the LSB page by increasing at least one of a time of precharging the bit lines and a time of evaluating the bit lines.

BRIEF DESCRIPTION OF THE DRAWINGS

FIG. 2 is a diagram illustrating a memory controller, such as that of FIG. 1.
FIG. 3 is a diagram illustrating a read fail processor, such as that of FIG. 2.

DETAILED DESCRIPTION

Figure 1:
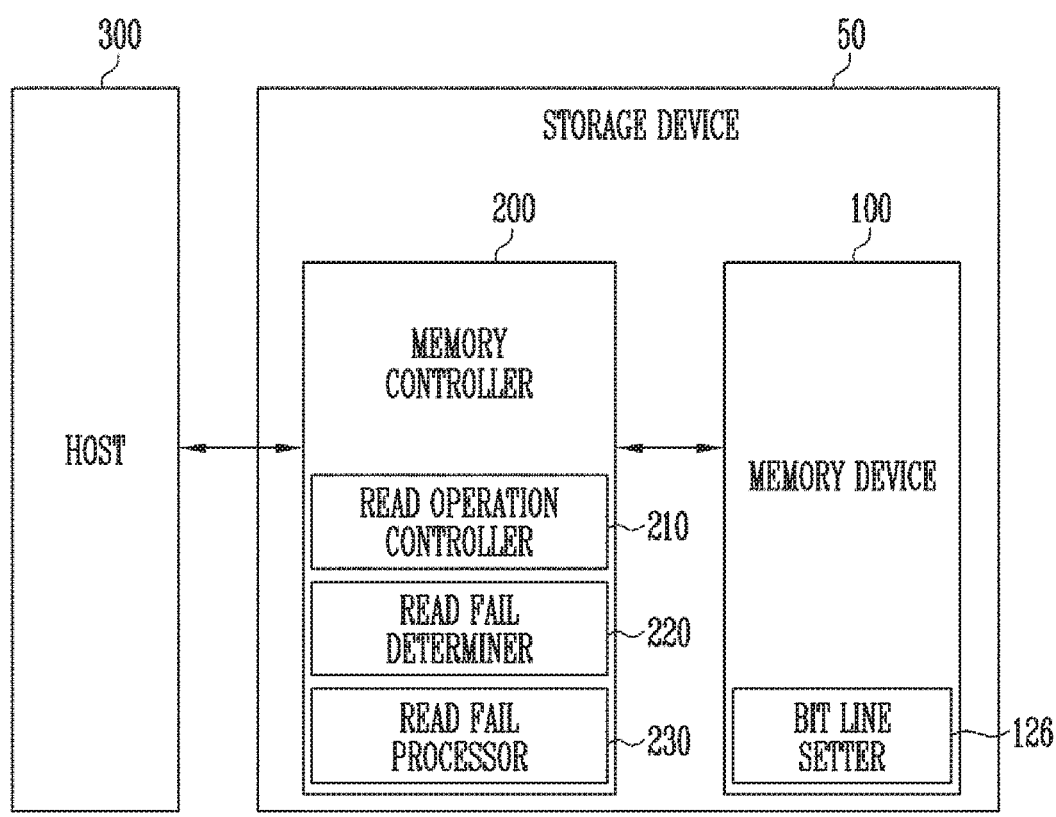
FIG. 1 is a block diagram illustrating a storage device according to an embodiment of the present disclosure.

Specific structural and functional description is directed to explaining the embodiments of the present disclosure. However, such description should not be construed as limiting the invention.

While specific embodiments of the invention are described in detail, elements and features of the present disclosure may be embodied in many different ways to form other embodiments, which may be variations or modifications of any of the disclosed embodiments. Thus, the present invention is not limited to only the embodiments set forth herein, but should be construed as covering all modifications, equivalents and alternatives falling within the scope of the claims. Moreover, throughout the specification, reference to "an embodiment, "another embodiment" or the like is not necessarily to only one embodiment, and different references to any such phrase are not necessarily to the same embodiment(s).

It will be understood that, although the terms "first" and/or "second" may be used herein to identify various elements, these elements should not be limited by these terms. These terms are only used to distinguish one element from another element that otherwise have the same or similar names. For example, a first element in one instance could be termed a second element in another instance, and vice versa, without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. The articles 'a' and 'an' as used in this application and the appended claims should generally be construed to mean 'one or more' unless specified otherwise or clear from context to be directed to a singular form. It will be further understood that the open-ended terms "comprise", "include", "have", etc. when used in this specification, specify the presence of stated features, integers, steps, operations, elements, components, and/or combinations of thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure pertains. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art are omitted to avoid obscuring the subject matter of the present disclosure. This aims to make the subject matter of the present disclosure clear.

Various embodiments of the present disclosure will now be described more fully with reference to the accompanying drawings, in which preferred embodiments of the present disclosure are illustrated, so that those skilled in the art can easily carry out the present invention.

FIG. 1 is a block diagram illustrating a storage device according to an embodiment of the present disclosure.

Referring to FIG. 1, a storage device 50 may include a memory device 100 and a memory controller 200.

The storage device 50 may store data under the control of a host 300, and may include, for example, a mobile phone, a smartphone, an MP3 player, a laptop computer, a desktop computer, a game console, a television (TV), a tablet PC, or an in-vehicle infotainment system.

The storage device 50 may be configured as any of various types of storage devices depending on a host interface that is a communication scheme with the host 300. For example, the storage device 50 may be implemented as any of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a microSD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include multiple planes. Each plane may include a plurality of memory blocks BLK1 to BLKz. Each memory block may include a plurality of memory cells. A single memory block may include a plurality of pages. In an embodiment, a page may be a unit by which data is stored in the memory device 100 or by which data stored in the memory device 100 is read. A memory block may be a unit by which data is erased. In an embodiment, the memory device 100 may take any of various alternative forms, such as a double data rate synchronous dynamic random access memory (DDR SDRAM), a low power double data rate fourth generation (LPDDR4) SDRAM, a graphics double data rate (GDDR) SDRAM, a Low Power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (SU-RAM). In context of the present specification, by way of example, the memory device 100 is a NAND flash memory.

In an embodiment, the memory device 100 may be implemented as a three-dimensional (3D) array structure. The present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, each of the memory cells included in the memory device 100 may be implemented as a Single-Level Cell (SLC) in which one data bit is stored. Alternatively, each of the memory cells included in the memory device 100 may be implemented as a Multi-level Cell (MLC) in which two data bits are stored, a Triple-Level Cell (TLC) in which three data bits are stored, or a Quad-Level Cell (QLC) in which four data bits are stored.

The memory device 100 may receive a command and an address from the memory controller 200, and may access the area of the memory cell array, selected by the address. That is, the memory device 100 performs an operation corresponding to the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

In an embodiment, the memory device 100 may include a bit line setter 126. In order for the memory device 100 to perform a specific operation, the bit line setter 126 may perform an operation of setting a bit line. In detail, the bit line setter 126 may set a voltage to be applied to the bit line. In an embodiment, the bit line setter 126 may set a time during which the voltage is to be applied to the bit line. Also, the bit line setter 126 may set a time during which the bit line is to be evaluated. The bit line setting information may be stored in a register in the memory device 100.

The memory device 100 may perform a program operation or an erase operation using a set operating voltage under the control of the memory controller 200.

The memory controller 200 may control the overall operation of the storage device 50.

When power is applied to the storage device 50, the memory controller 200 may run firmware. When the memory device 100 is a flash memory device, the memory controller 200 may run firmware such as a Flash Translation Layer (FTL) for controlling communication between the host 300 and the memory device 100.

In an embodiment, the memory controller 200 may receive data and a logical block address (LBA) from the host 300, and may translate the logical block address (LBA) into a physical block address (PBA) indicating the address of memory cells in the memory device 100 in which data is to be stored. Further, the memory controller 200 may store a logical-physical address mapping table, which configures mapping relationships between logical block addresses (LBA) and physical block addresses (PBA), in a buffer memory.

The memory controller 200 may control the memory device 100 so that a program operation, a read operation or an erase operation is performed in response to a request received from the host 300. During a program operation, the memory controller 200 may provide a program command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a program command, an address, and data without receiving a request from the host 300, and may transmit the generated program command, address, and data to the memory device 100. For example, the memory controller 200 may provide commands, addresses, and data to the memory device 100 so as to perform background operations, such as a program operation for wear leveling and a program operation for garbage collection.

In an embodiment, the memory controller 200 may include a read operation controller 210. The read operation controller 210 may control the memory device 100 so that the memory device 100 is capable of performing a read operation. In detail, the read operation controller 210 may provide a read command READ_CMD to the memory device 100 for a read operation. The read operation controller 210 may be provided with read data READ_DATA from the memory device 100 as a result of the read operation of the memory device 100. The read data READ_DATA provided from the memory device 100 may be provided to a read fail determiner 220.

In an embodiment, the memory controller 200 may include the read fail determiner 220. The read fail determiner 220 may determine whether the read operation performed by the memory device 100 has passed or failed. A pass of the read operation may represent a success in the read operation. Also, a fail of the read operation may represent the failure of the read operation.

The read fail determiner 220 may determine, based on the read data READ_DATA received from the memory device 100, whether the read operation has passed or failed. That is, the read fail determiner 220 may determine, based on the read data READ_DATA, whether the read operation has succeeded (passed) or failed. The read fail determiner 220 may provide the result of determining whether the read operation has passed or failed to a read fail processor 230. The read fail determiner 220 may generate read information READ_INF including both the pass/fail result and information about performance of the read operation. The read fail determiner 220 may provide the read information READ_INF to the read fail processor 230.

In an embodiment, the memory controller 200 may include the read fail processor 230. When the read operation is determined to have failed, the read fail processor 230 may set a next read operation. The next read operation may be a read retry operation. In an embodiment, an operation of setting a control time for the bit line may be performed. The bit line control time may be set, and the read operation may be performed based on the set control time.

In an embodiment, the memory controller 200 may control at least two memory devices 100. In this case, the memory controller 200 may control the memory devices 100 depending on an interleaving scheme to improve operating performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

FIG. 2 is a diagram illustrating the memory controller 200 of FIG. 1.

Referring to FIG. 2, the memory controller 200 may include the read operation controller 210, the read fail determiner 220, and the read fail processor 230.

In an embodiment, the memory controller 200 may include the read operation controller 210. The read operation controller 210 may perform a read operation corresponding to a read request received from a host 300. The read operation controller 210 may provide a read command READ_CMD to the memory device 100 when a read operation is performed on a page selected from among a plurality of pages included in the memory device 100.

The read operation controller 210 may receive read data READ_DATA corresponding to the read command. The read data READ_DATA may be obtained when the memory device 100 performs the read operation. Based on the read data READ_DATA obtained from the memory device 100, whether the read operation has passed or failed may be determined. A pass of the read operation may represent a success in the read operation. Also, a fail of the read operation may represent the failure of the read operation. The read operation controller 210 may provide the read data READ_DATA to the read fail determiner 220.

In an embodiment, the memory controller 200 may include the read fail determiner 220. The read fail determiner 220 may receive the read data READ_DATA from the read operation controller 210. The read fail determiner 220 may determine, based on the read data READ_DATA, whether the read operation has passed or failed. That is, the read fail determiner 220 may determine, based on the read data READ_DATA, whether the read operation has succeeded or failed.

The read fail determiner 220 may generate read information READ_INF including both the result of determination of the read operation, obtained by determining a pass or fail of the read operation based on the read data READ_DATA, and information about performance of the read operation. The result of determination of the read operation (read operation determination result) may include information indicative of whether the read operation passed or failed. The information about performance of the read operation (read operation performance information) may include information about the number of read retry operations performed due to failure(s) of the read operation and information about read voltages for performing the read operation(s).

In detail, when error(s) included in the read data READ_DATA corresponding to the selected page falls out of a correctable range, the read fail determiner 220 may determine that the read operation has failed. In contrast, when error(s) included in the read data READ_DATA corresponding to the selected page falls within the correctable range, the read fail determiner 220 may determine that the read operation has succeeded (passed).

In detail, when error(s) included in the read data READ_DATA corresponding to the selected page falls out of the correctable range, the read fail determiner 220 may generate read information READ_INF including information about the failed of the read operation. In detail, the read fail determiner 220 may generate read information READ_INF in which information about the failure of the read operation is included in the read operation determination result.

In an embodiment, the memory controller 200 may include the read fail processor 230. The read fail processor 230 may be provided with the read information READ_INF from the read fail determiner 220. The read information READ_INF may include both the read operation determination result and the read operation performance information.

The read fail processor 230 may select one of a read retry operation on the selected page and an operation of setting a control time for a bit line coupled to the selected page, based on the read information READ_INF. The read retry operation may be performed at a voltage level different from a voltage level used when the failed read operation is performed. The read retry operation may be performed a set or predetermined number of times after the read operation has failed.

In detail, when selecting the read retry operation, the read fail processor 230 may provide read voltage setting information VREAD_INF including information about the levels of the read voltages to the read operation controller 210.

When selecting the operation of setting the bit line control time, the read fail processor 230 may provide bit line control data BLCTRL_DATA to the memory device 100.

The read fail processor 230 will be described in greater detail below with reference to FIG. 3.

FIG. 3 is a diagram illustrating the read fail processor 230 of FIG. 2.

Referring to FIG. 3, the read fail processor 230 may include a read operation decision component 231, a read retry table 232, and a bit line setting table 233.

When read information READ_INF provided by the read fail determiner 220 includes information about a fail of a read operation, the read operation decision component 231 may decide on a next read operation. The next read operation may be one of a read retry operation on a selected page and an operation of setting a control time for a bit line coupled to the selected page. When the read operation decision component 231 selects the operation of setting the control time for the bit line, the memory device 100 may perform a read operation based on the set control time.

The read operation decision component 231 may select one of the read retry operation on the selected page and an operation of setting the control time for the bit line coupled to the selected page, regardless of a previously performed read operation. Therefore, when a previously performed read operation fails, the memory device 100 may perform the read retry operation. Alternatively, when the previously performed read operation fails, the memory device 100 may set the control time for the bit line and then may again perform a read operation based on the set bit line control time.

The read operation decision component 231 may select one of the read retry operation on the selected page and the operation of setting the control time for the bit line coupled to the selected page, based on a previously performed read operation.

In detail, the read operation determination result may include information about the failure of the read operation, and the read operation performance information may include information indicating that not all read retry operations have been performed based on a plurality of pieces of read retry operation information included in the read retry table 232. The read retry operations based on the plurality of pieces of read retry operation information may be read operations to be performed immediately after the read operation has failed. The read retry operations to be performed after the read operation has failed may have priorities. The priorities of the read retry operations may be determined according to a previously read voltage. The read retry operations are performed using read voltages gradually decreasing (or increasing) from the previously read voltage. That is, the priorities of the read retry operations may be a sequence of read operations performed with gradually decreasing (or increasing) read voltages. Moreover, the priorities of the read retry operations may be predetermined, and the priorities of the read retry operations may be not changed by the read retry operations. When the corresponding read operation fails, the read retry operations may be performed in accordance with their priorities.

The read operation determination result may include information about the failure of the read operation, and the read operation performance information may include information indicating that not all read retry operations have been performed based on the plurality of pieces of read retry operation information included in the read retry table 232. In this case, the read operation decision component 231 may select one piece of read retry operation information, from among the plurality of such pieces, and may perform control so that the memory device 100 performs the read retry operation according to the selected piece of read retry operation information. The memory device 100 may perform read retry operations in accordance with their priorities according to the plurality of pieces of read retry operation information in the read retry table 232 until a read retry operation passes or until a maximum number of read retry operations is reached, that is, all of the read retry operations are unsuccessfully performed.

When all of the read retry operations to the selected page have failed, the read operation decision component 231 may perform control so that the memory device 100 performs the operation of setting the control time for the bit line coupled to the selected page. After the operation of setting the bit line control time has been performed, the memory device 100 may perform a read operation based on the set control time.

When deciding on which read retry operation to perform on the selected page, the read operation decision component 231 may generate read retry information RRT_INF. The read retry information RRT_INF may include information about a previously performed read retry operation among the plurality of read retry operations available depending on their priorities as indicated by the plurality of pieces of read retry operation information included in the read retry table 232.

The read operation decision component 231 may provide the read retry information RRT_INF to the read retry table 232. The read retry table 232 may include a plurality of pieces of read retry operation information about the respective read retry operations. The plurality of pieces of read retry operation information may include respective read voltages at different levels that to be used to perform the read retry operations. That is, the read retry table 232 may store plural pieces of read voltage information for the read retry operations. The read retry table 232 may store the read voltage information of the read retry operations to be performed to indicate their relative priorities.

The read retry table 232 may provide read voltage setting information VREAD_INF to the read operation controller 210 so as to perform the next read retry operation among the available read retry operations. The read voltage setting information VREAD_INF may include information about a read operation voltage for a next read retry operation. The read operation controller 210 may provide a read command to the memory device 100 based on the read voltage setting information VREAD_INF.

Consequently, the read fail processor 230 may select one piece of read retry operation information from among a plurality of such pieces so as to perform a selected read retry operation, and may generate the read voltage setting information VREAD_INF for deciding on a read voltage corresponding to the selected read retry operation information. The read fail processor 230 may provide the generated read voltage setting information VREAD_INF to the read operation controller 210. In order to perform a read retry operation using the read voltage in the read voltage setting information VREAD_INF, the read operation controller 210 may provide a read command to the memory device 100.

In an embodiment, the read operation determination result may include information about the failure of the read operation, and the read operation performance information may include information indicating that all read retry operations have been performed according to the plurality of pieces of read retry operation information in the read retry table 232. In this case, the read operation decision component 231 may select the operation of setting the control time for the bit line coupled to the selected page. When the operation of setting the bit line control time is selected, the read operation decision component 231 may generate bit line information BL_INF. The bit line information BL_INF may include information about a time during which the bit line is precharged (bit line precharge time) and a time during which the bit line is evaluated (bit line evaluation time) when the read operation fails. The read operation decision component 231 may provide the bit line information BL_INF to the bit line setting table 233.

The bit line setting table 233 may store information about a bit line precharge time and a bit line evaluation time that are to be applied during a next read operation.

Unless the bit line precharge time or the bit line evaluation time is sufficiently secured, error may occur during sensing of the voltage or current of the bit line. Therefore, there is a need to sufficiently secure the bit line precharge time and the bit line evaluation time.

The bit line setting table 233 may store information about an optimal bit line precharge time and an optimal bit line evaluation time that allow each memory cell to pass the read operation. The optimal bit line precharge time and the optimal bit line evaluation time may vary for each memory cell. That is, depending on the temperature of each memory cell, the number of program and erase operations that are performed, or the like, the optimal bit line precharge time and the optimal bit line evaluation time may vary.

Thus, the bit line setting table 233 may generate bit line control data BLCTRL_DATA that increases the bit line precharge time specified in the bit line information BL_INF and/or increases the bit line evaluation time specified in the bit line information BL_INF. Data for setting the bit line precharge time and/or the bit line evaluation time included in the bit line control data BLCTRL_DATA may be data for setting an optimal time allowing each memory cell to pass the read operation.

The bit line setting table 233 may provide the bit line control data BLCTRL_DATA to the memory device 100. The bit line control data BLCTRL_DATA may be stored in the memory device 100 in response to a set-parameter command.

Figure 4:
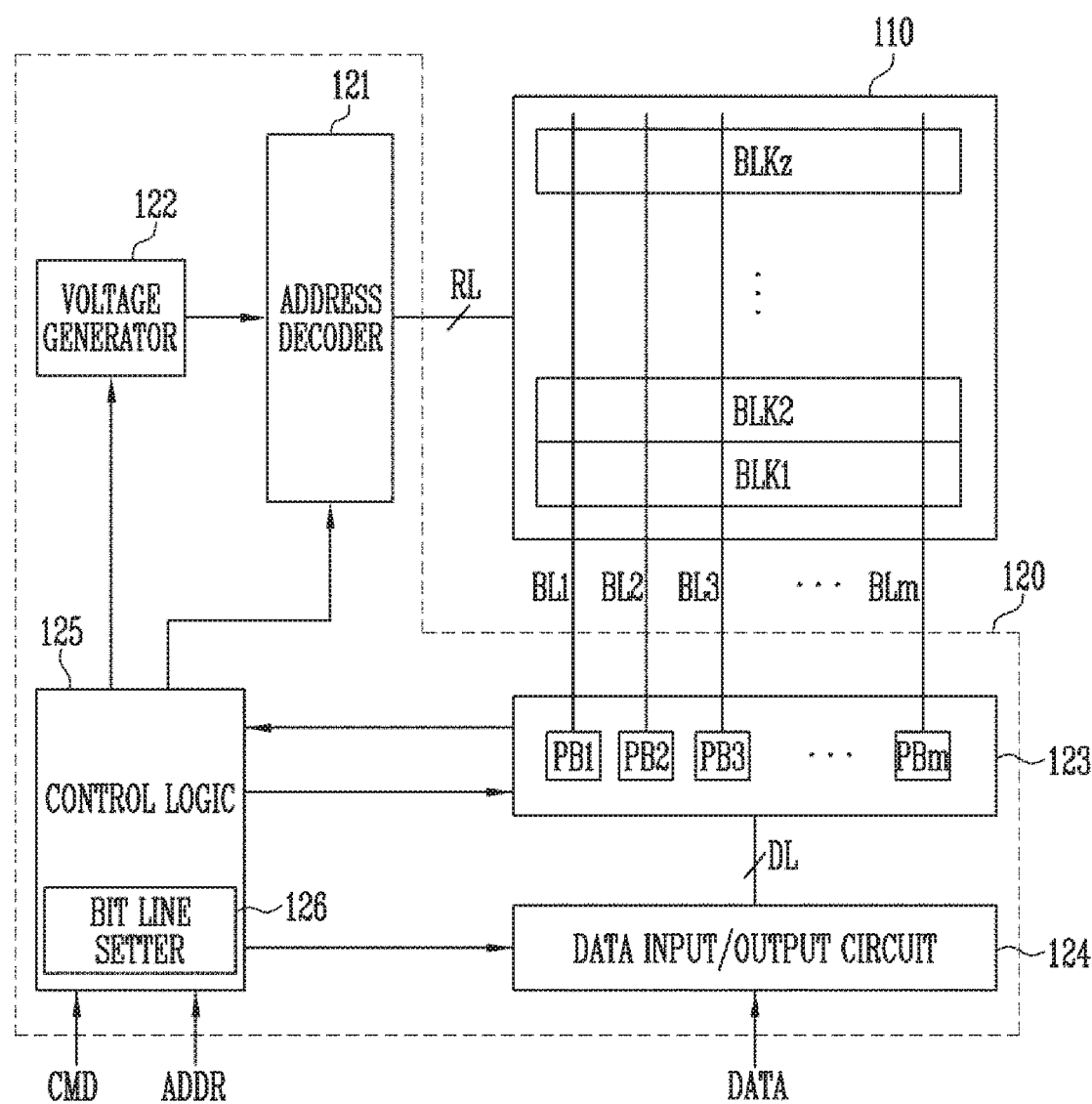
FIG. 4 is a diagram illustrating the structure of a memory device, such as that of FIG. 1.

FIG. 4 is a diagram illustrating the structure of the memory device 100 of FIG. 1.

Referring to FIG. 4, the memory device 100 may include a memory cell array 110, a peripheral circuit 120, and control logic 125.

The memory cell array 110 includes a plurality of memory blocks BLK1 to BLKz. The memory blocks BLK1 to BLKz are coupled to an address decoder 121 through row lines RL and are coupled to a read and write circuit 123 through bit lines BL1 to BLm. Each of the memory blocks BLK1 to BLKz includes a plurality of memory cells. In an embodiment, the plurality of memory cells may be nonvolatile memory cells.

The memory cells included in the memory cell array 110 may be grouped into a plurality of blocks according to the usage purpose thereof. System information corresponding to various types of setting information required to control the memory device 100 may be stored in the plurality of blocks.

Each of the first to z-th memory blocks BLK1 to BLKz includes a plurality of cell strings. First to m-th cell strings are respectively coupled to the first to m-th bit lines BL1 to BLm. Each of the first to m-th cell strings includes a drain select transistor, a plurality of series-coupled memory cells, and a source select transistor. The drain select transistor DST is coupled to a drain select line DSL. First to n-th memory cells are respectively coupled to first to n-th word lines WL1 to WLn. The source select transistor SST is coupled to a source select line SSL. A drain of the drain select transistor DST is coupled to the corresponding bit line. The drain select transistors of the first to m-th cell strings are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz. The drain select line DSL, the first to n-th word lines WL1 to WLn, and the source select line SSL are included in the row lines RL. The drain select line DSL, the first to n-th word lines WL1 to WLn, and the source select line SSL are controlled by the address decoder 121. The common source line CSL is controlled by the control logic 125. The first to m-th bit lines BL1 to BLm are controlled by the read and write circuit 123.

The peripheral circuit 120 may include the address decoder 121, a voltage generator 122, the read and write circuit 123, a data input/output circuit 124, and the control logic 125.

The address decoder 121 is coupled to the memory cell array 110 through the row lines RL. The address decoder 121 may be operated under the control of the control logic 125. The address decoder 121 receives addresses ADDR through the control logic 125.

In an embodiment, the program operation and the read operation of the memory device 100 are each performed on a page basis.

During the program and read operations, the addresses ADDR received by the control logic 125 may include a block address and a row address. The address decoder 121 may decode the block address among the received addresses ADDR. The address decoder 121 selects one of the memory blocks BLK1 to BLKz in response to the decoded block address.

The address decoder 121 may decode the row address among the received addresses ADDR. In response to the decoded row address, the address decoder 121 applies voltages, provided from the voltage generator 122, to the row lines RL and then selects one word line of the selected memory block.

During an erase operation, the addresses ADDR include a block address. The address decoder 121 may decode the block address and select one memory block in response to the decoded block address. An erase operation may be performed on all or part of one memory block.

During a partial erase operation, the addresses ADDR may include block and row addresses. The address decoder 121 selects one of the memory blocks BLK1 to BLKz in response to the decoded block address.

The address decoder 121 may decode the row addresses among the received addresses ADDR. In response to the decoded row addresses, the address decoder 121 applies voltages, provided from the voltage generator 122, to the row lines RL and then selects at least one word line of the selected memory block.

In an embodiment, the address decoder 121 may include a block decoder, a word line decoder, an address buffer, and the like.

The voltage generator 122 may generate a plurality of voltages using an external supply voltage provided to the memory device 100. The voltage generator 122 is operated under the control of the control logic 125.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage. For example, the voltage generator 122 may include a plurality of pumping capacitors for receiving the internal supply voltage, and may generate a plurality of voltages by selectively enabling the plurality of pumping capacitors under the control of the control logic 125. The generated voltages are applied to word lines selected by the address decoder 121.

During a program operation, the voltage generator 122 may generate a high-voltage program pulse and a pass pulse lower than the program pulse. During a read operation, the voltage generator 122 may generate a read voltage and a pass voltage higher than the read voltage. During an erase operation, the voltage generator 122 may generate an erase voltage.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 125.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data, received through the data input/output circuit 124, to selected memory cells through the bit lines BL1 to BLm when a program pulse is applied to each selected word line. The memory cells in the selected page are programmed based on the transferred data. Memory cells coupled to a bit line to which a program permission voltage (e.g., a ground voltage) is applied may have increased threshold voltages. Threshold voltages of memory cells coupled to a bit line to which a program inhibition voltage (e.g., a supply voltage) is applied may be maintained. During a program verify operation, the first to m-th page buffers may read page data from the selected memory cells through the bit lines BL1 to BLm.

During a read operation, the read and write circuit 123 may read data from the memory cells in the selected page through the bit lines BL, and may output the read data to the data input/output circuit 124. During an erase operation, the read and write circuit 123 may allow the bit lines BL to float.

In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 125. During a program operation, the data input/output circuit 124 receives data DATA to be stored from an external controller (not illustrated).

The control logic 125 is coupled to the address decoder 121, the voltage generator 122, the read and write circuit 123, and the data input/output circuit 124. The control logic 125 may control the overall operation of the memory device 100. The control logic 125 receives a command CMD and addresses ADDR from the external controller. The control logic 125 may control the address decoder 121, the voltage generator 122, the read and write circuit 123, and the data input/output circuit 124 in response to the command CMD.

In an embodiment, the control logic 125 may include a bit line setter 126.

When the read operation decision component 231 selects an operation for setting a control time for a bit line coupled to a selected page, the bit line setter 126 may set a time during which the bit line is to be precharged (bit line precharge time) and/or a time during which the bit line is to be evaluated (bit line evaluation time).

In an embodiment, the memory device 100 may store, in a register, data to set the bit line precharge time and the bit line evaluation time corresponding to the bit line control data BLCTRL_DATA using the set-parameter command.

The bit line setter 126 may set a bit line precharge time and/or a bit line evaluation time when performing, after the read operation has failed, a subsequent read operation. The bit line setter 126 may set the bit line precharge time and/or the bit line evaluation time using the data stored in the register.

Figure 5:
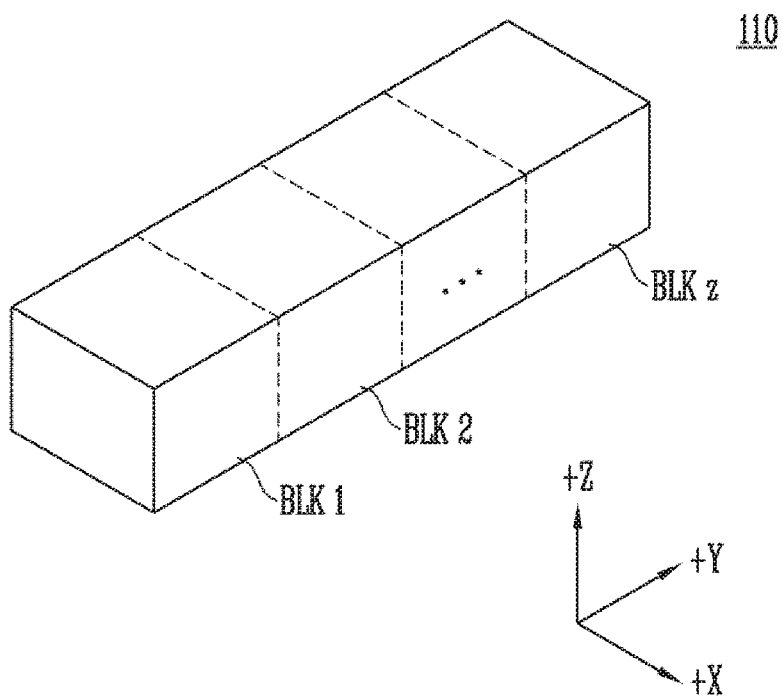
FIG. 5 is a diagram illustrating an embodiment of a memory cell array, such as that of FIG. 4.

FIG. 5 is a diagram illustrating an embodiment of the memory cell array of FIG. 4.

Referring to FIG. 5, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described in detail below with reference to FIGS. 6 and 7.

Figure 6:
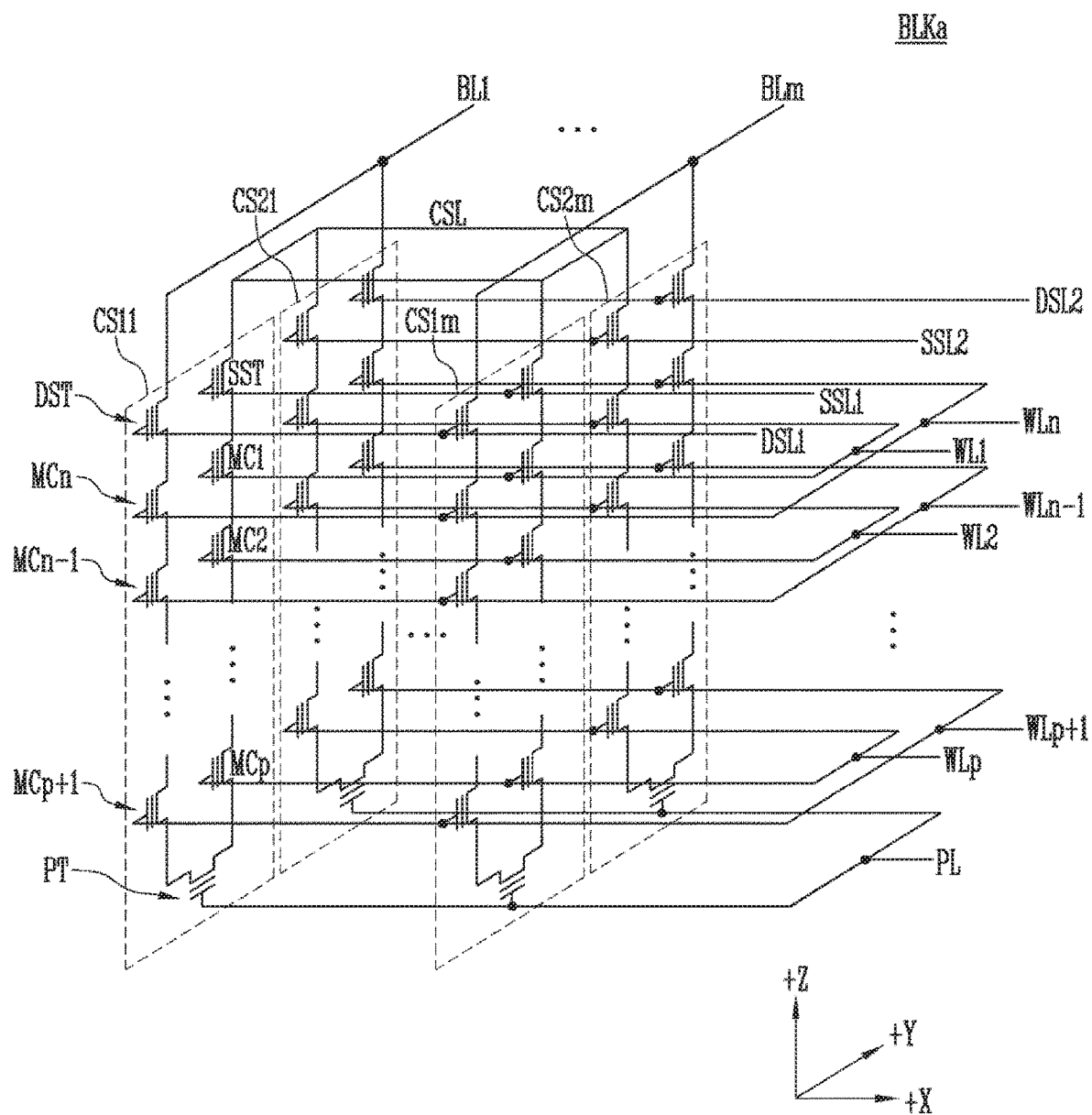
FIG. 6 is a circuit diagram illustrating an example of any one memory block BLKa of memory blocks BLK1 to BLKz of FIG. 4.

FIG. 6 is a circuit diagram illustrating any one memory block BLKa of the memory blocks BLK1 to BLKz of FIG. 4.

Referring to FIG. 6, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e. a positive (+) X direction). In FIG. 6, two cell strings are illustrated as being arranged in a column direction (i.e. a positive (+) Y direction). However, this illustration is for clarity; it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 6, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be grouped into first to p-th memory cells MC1 to MCp and p+1-th to n-th memory cells MCp+1 to MCn. The first to p-th memory cells MC1 to MCp are sequentially arranged in a negative (−Z) direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 6, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, dummy memory cell(s) are provided to reduce an electric field between the source select transistor SST and the memory cells MC1 to MCp. Alternatively, the dummy memory cell(s) are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer dummy memory cells are provided, the size of the memory block BLKa is reduced, but the reliability of the operation of the memory block BLKa may be deteriorated.

In order to efficiently control the dummy memory cell(s), each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 7:
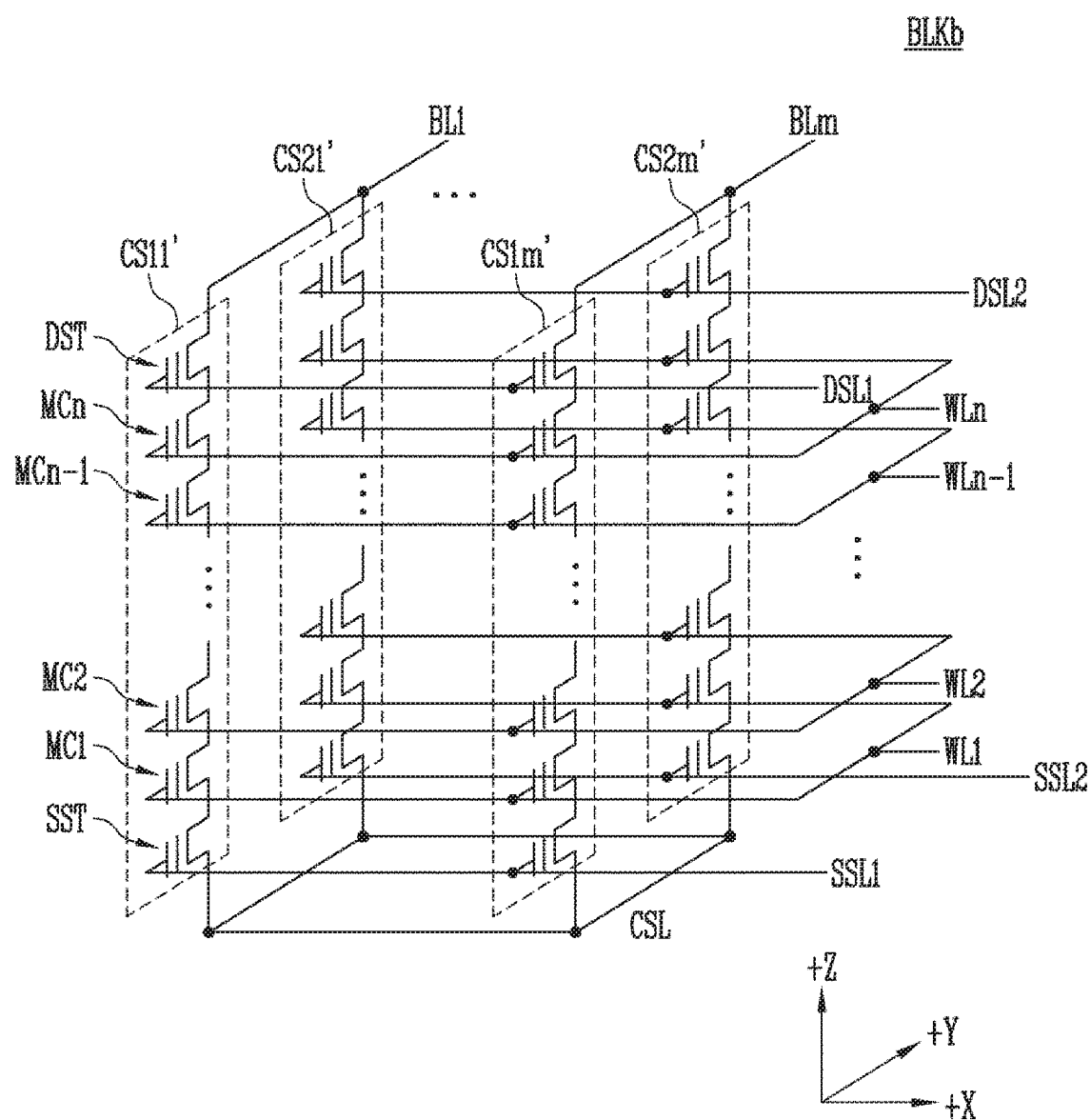
FIG. 7 is a circuit diagram illustrating an example of any one memory block BLKb of the memory blocks BLK1 to BLKz of FIG. 4.

FIG. 7 is a circuit diagram illustrating an example of any one memory block BLKb of the memory blocks BLK1 to BLKz of FIG. 4.

Referring to FIG. 7, the memory block BLKb includes a plurality of cell strings CS11' to CS1m' and CS21' to CS2m'. Each of the plurality of cell strings CS11' to CS1m' and CS21' to CS2m' extends in a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 7 has an equivalent circuit similar to that of the memory block BLKa of FIG. 6 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, dummy memory cell(s) are provided to reduce an electric field between the source select transistor SST and the memory cells MC1 to MCn. Alternatively, the dummy memory cell(s) are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer dummy memory cells are provided, the size of the memory block BLKb is reduced, but the reliability of the operation of the memory block BLKb may be deteriorated.

In order to efficiently control the dummy memory cell(s), each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

FIGS. 8A to 8D are diagrams for explaining the threshold voltage distribution of multi-level cells.

Referring to FIGS. 8A to 8D, the horizontal axis denotes the threshold voltages of memory cells and the vertical axis denotes the number of memory cells.

A memory device may perform a program operation on a page basis. A plurality of memory cells coupled to a single word line may constitute a single physical page. The physical page may be the unit of a program operation or a read operation.

The memory device may program memory cells coupled to a word line selected from among a plurality of word lines depending on data to be stored.

Figure 8A:
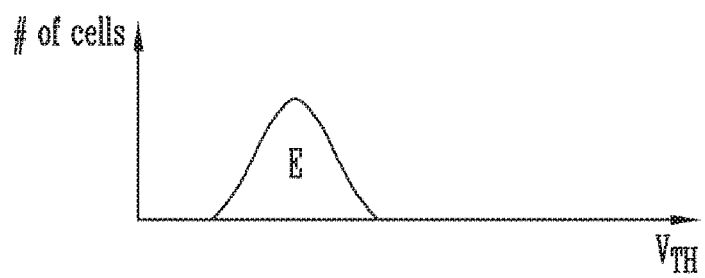
FIGS. 8A to 8D are diagrams for explaining the threshold voltage distribution of multi-level cells.

The selected memory cells, which are memory cells coupled to the selected word line, may have a threshold voltage distribution corresponding to an erased state E, as illustrated in FIG. 8A, before a program operation is performed.

When a memory cell stores data of 1 bit, the memory cell may be programmed to have a threshold voltage corresponding to one of the erased state E and a programmed state P.

The erased state E may correspond to data '1', and the programmed state P may correspond to data '0'. However, this bit designation is merely an example. In another embodiment, the erased state E may correspond to data '0', and the programmed state P may correspond to data '1'.

Figure 8B:
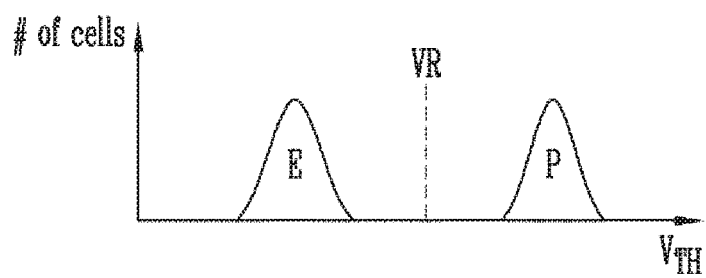

When the program operation is terminated, each of the selected memory cells may have a threshold voltage corresponding to one of the erased state E and the programmed state P, as illustrated in FIG. 8B. The memory device 100 may read data stored in the selected memory cells by performing a read operation using a read voltage VR between the erased state E and the programmed state P.

Figure 8C:
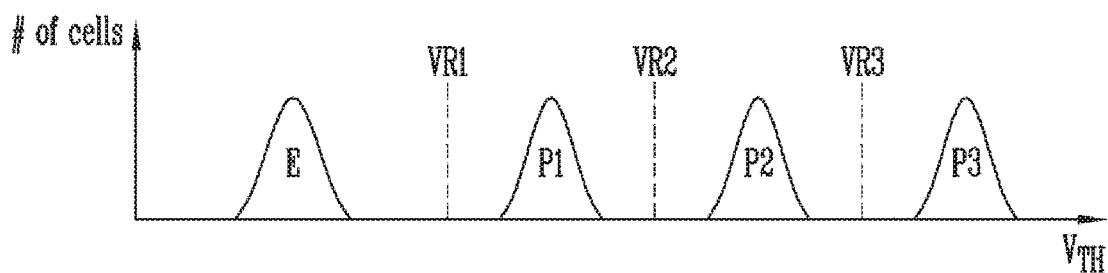

When each memory cell stores data of 2 bits, the memory cell may be reprogrammed in a threshold voltage distribution illustrated in FIG. 8C. In detail, the memory cell may be programmed to have a threshold voltage corresponding to any one of the erased state E, a first programmed state P1, a second programmed state P2, and a third programmed state P3.

The erased state E may correspond to data '11', the first programmed state P1 may correspond to '10', the second programmed state P2 may correspond to data '00', and the third programmed state P3 may correspond to data '01'. However, these data representations are merely examples; other representations may be used.

When the program operation is terminated, each of the selected memory cells may have a threshold voltage corresponding to any one of the erased state E, the first programmed state P1, the second programmed state P2, and the third programmed state P3, as illustrated in FIG. 8C. The memory device may read data stored in the selected memory cells by performing a read operation using a first read voltage VR1 to a third read voltage VR3.

Here, the first read voltage VR1 may have a value for distinguishing the erased state E from the first programmed state P1, the second read voltage VR2 may have a value for distinguishing the first programmed state P1 from the second programmed state P2, and the third read voltage VR3 may have a value for distinguishing the second programmed state P2 from the third programmed state P3.

Figure 8D:
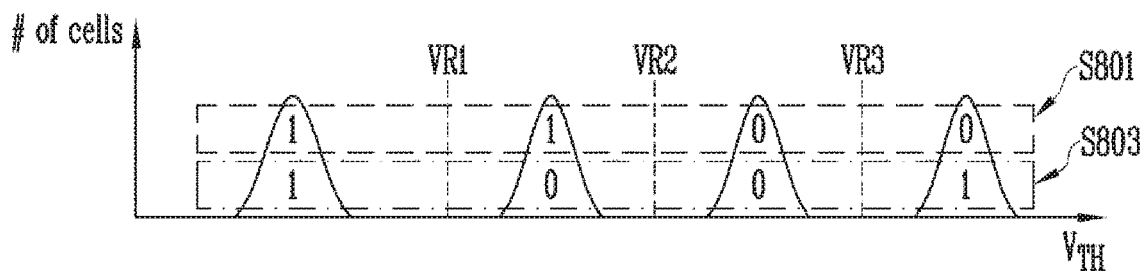

Referring to FIG. 8D, a plurality of memory cells coupled to a single word line may constitute a plurality of logical pages. In the case of multi-level cells, the plurality of logical pages may consist of an upper bit (i.e., Most Significant Bit: MSB) page S801 and a lower bit (i.e., Least Significant Bit: LSB) page S803. The MSB page S801 may store MSB data, and the LSB page S803 may store LSB data.

The MSB page S801 may be programmed such that the erased state E and the first programmed state P1 are distinguished from the second programmed state P2 and the third programmed state P3. That is, in the MSB page S801, the erased state E and the first programmed state P1 may correspond to data '1', and the second programmed state P2 and the third programmed state P3 may correspond to data '0'.

The LSB page S803 may be programmed such that the erased state E is distinguished from the first programmed state P1. Also, the LSB page S803 may be programmed such that the second programmed state P2 is distinguished from the third programmed state P3.

In order to distinguish programmed states of the MSB page S801, the read operation may be performed using the second read voltage VR2. Further, in order to distinguish programmed states of the LSB page S803, the read operation may be performed using the first read voltage VR1 and the third read voltage VR3. The result of the read operation performed using the first read voltage VR1 and the third read voltage VR3 may be derived using an exclusive OR (XOR) operation. The programmed states of memory cells may be distinguished from each other based on the result of the derivation.

Figure 9A:
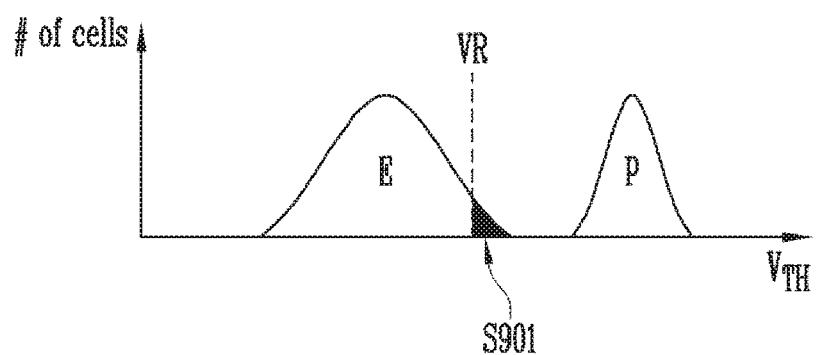
FIGS. 9A and 9B are diagrams for explaining a case where a read operation fails.
Figure 9B:
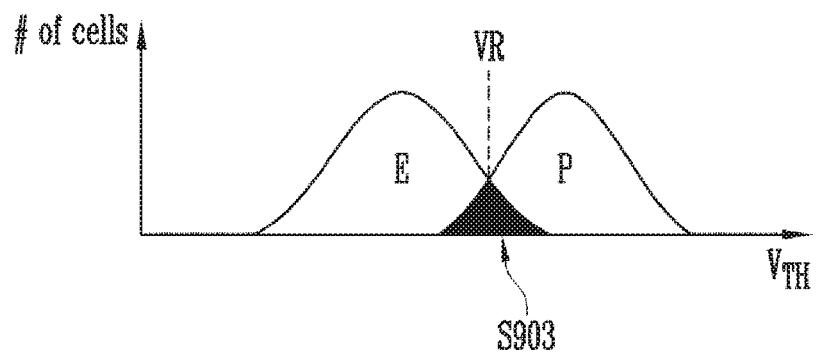

FIGS. 9A and 9B are diagrams for explaining a case where a read operation fails.

Referring to FIGS. 9A and 9B, the horizontal axis denotes threshold voltages of memory cells and the vertical axis denotes the number of memory cells. The threshold voltage distribution of the memory cells may vary depending on the temperatures of the memory cells and the number of program and erase operations that are performed.

FIG. 9A illustrates a case where the threshold voltage distribution of memory cells in an erased state E is widened. When the threshold voltage distribution is widened, the memory cells in the erased state E may be read as being in a programmed state P. In detail, in FIG. 9A, when a selected page is read using a read voltage VR, memory cells included in S901 may be read as being in the programmed state P. The memory cells included in S901 may be read as being in the programmed state P even if they are in the erased state E.

When the number of memory cells distributed in S901 included in the selected page falls out of an error-correctable range, the read operation may fail. In this case, the memory device 100 may read the selected page using a new read voltage through a read retry operation. The new read voltage may be a voltage for reading the erased state E and the programmed state P. When the read retry operation is performed, the read operation may pass.

Before or after performing the read retry operation, the memory device 100 may set an optimal bit line precharge time and an optimal bit line evaluation time which enable the read operation to pass. Unless the bit line precharge time and/or the bit line evaluation time are sufficiently secured, error may occur during a procedure for sensing the voltage or current of the bit line. Therefore, before or after performing the read retry operation, the memory device 100 may lengthen the bit line precharge time and/or the bit line evaluation time relative to a previous bit line precharge time and/or a previous bit line evaluation time. After setting the bit line precharge time and/or the bit line evaluation time, either of which may be longer than that previously used, the memory device 100 may perform the read operation according to the newly set bit line precharge time and/or the set bit line evaluation time.

FIG. 9B illustrates a case where threshold voltage distributions of memory cells in an erased state E and a programmed state P are widened. When the threshold voltage distributions are widened, memory cells in the erased state E may be read as being in the programmed state P. Also, memory cells in the programmed state P may be read as being in the erased state E. In detail, some of memory cells included in S903 may be read as being in the programmed state P even if they are in the erased state E. Further, some of memory cells included in S903 may be read as being in the erased state E even if they are in the programmed state P. Therefore, in order for the memory device 100 to perform a normal read operation, an optimal read voltage VR may be set. That is, the read voltage VR for minimizing the occurrence of a case S903 where memory cells in the erased state E are read as being in the programmed state P and where memory cells in the programmed state P are read as being in the erased state E may be set.

When the read voltage VR is reset, the memory device 100 may perform a read retry operation. After the read retry operation has been performed, memory cells in which error has occurred may be error-corrected. When the number of memory cells in which an error has occurred falls out of the error-correctable range, the read operation may fail again. When the read operation has failed again, a memory block including the selected memory cells may be processed as a bad block.

Figure 10A:
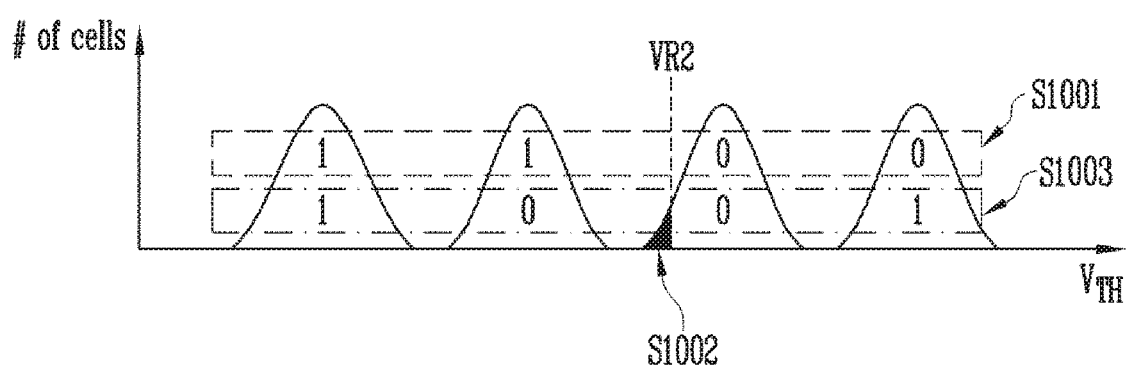
FIGS. 10A and 10B are diagrams for explaining failure of hard and soft read operations.
Figure 10B:
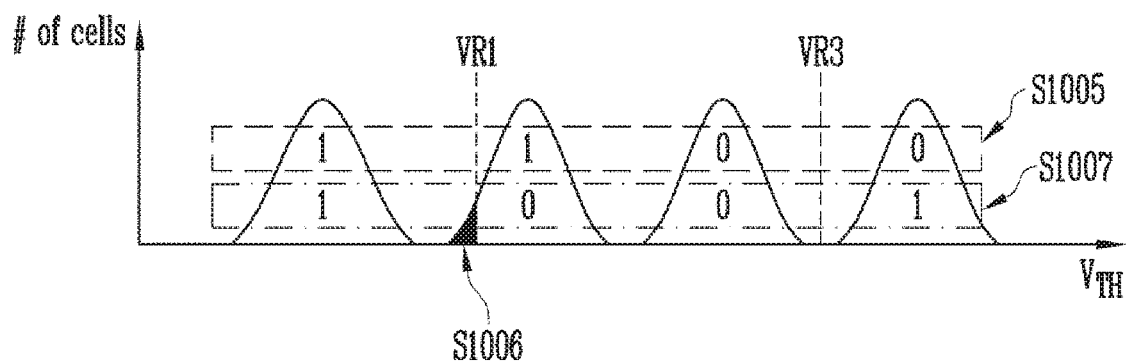

FIGS. 10A and 10B are diagrams for explaining hard and soft read failures of a read operation.

Referring to FIGS. 10A and 10B, the horizontal axis denotes threshold voltages of memory cells and the vertical axis denotes the number of memory cells.

A plurality of memory cells coupled to a single word line may constitute a plurality of logical pages. In the case of multi-level cells, the plurality of logical pages may consist of an upper bit (i.e., MSB) page S1001 or S1005 and a lower bit (i.e., LSB) page S1003 or S1007. Each of the MSB pages S1001 and S1005 may store MSB data, and each of the LSB pages S1003 and S1007 may store LSB data.

In order to distinguish programmed states of memory cells within the MSB page S1001 or S1005, the read operation may be performed using a second read voltage VR2. Further, in order to distinguish programmed states of memory cells within the LSB page S1003 or S1007, the read operation may be performed using a first read voltage VR1 and a third read voltage VR3.

FIG. 10A illustrates memory cells distributed in S1002 in which a bit error occurs when a read operation for distinguishing the programmed states of memory cells within the MSB page S1001 is performed. When the read operation is performed using the second read voltage VR2, the memory cells distributed in S1002 may be read as being in an erased state E ('1') even if those memory cells distributed in S1002 within the MSB page S1001 are in a programmed state.

When the number of memory cells distributed in S1002 included in the selected page falls out of an error-correctable range, the read operation may fail. Such a fail of the read operation may represent a failure of a hard read operation. That is, when memory cells within the MSB page S1001 are read as being in the programmed state even if those memory cells are in the erased state, or when memory cells within the MSB page S1001 are read as being in the erased state even if those memory cells are in the programmed state, the hard read operation may fail.

When failure of the hard read operation occurs, a read retry operation may be performed according to the plurality of pieces of read retry operation information in the read retry table 232. Through the read retry operation, the read operation may pass. Further, when the hard read operation fails during the read operation, an operation of setting a control time for a bit line may not be performed. That is, the operation of setting the bit line control time may not be performed, and only the read retry operation may be performed.

FIG. 10B illustrates memory cells distributed in S1006 in which a bit error occurs when a read operation for distinguishing programmed states of memory cells within the LSB page S1007 is performed. A read operation on the LSB page S1007 may be performed after a read operation on the MSB page S1005 has succeeded (passed).

Further, in order to distinguish the programmed states of memory cells within the LSB page S1007, the read operation may be performed using the first read voltage VR1 and the third read voltage VR3. When the read operation is performed using the first read voltage VR1 and the third read voltage VR3, the memory cells distributed in S1006 may be read as being in the erased state E ('1') even if they are in the programmed state.

When the number of memory cells distributed in S1006 included in the selected page falls out of an error-correctable range, the read operation may fail. Such a fail of the read operation may represent failure of a soft read operation. That is, when memory cells within the LSB page S1007 are read as being in the programmed state even if those memory cells are in the erased state, or when memory cells within the LSB page S1007 are read as being in the erased state even if those memory cells are in the programmed state, the soft read operation may fail.

When the soft read operation fails during a read operation, a read retry operation may be performed according to the plurality of pieces of read retry operation information included in the read retry table 232 or, alternatively, an operation of setting a control time for a bit line may be performed. That is, when the soft read operation fails during a read operation, a read fail processor 230 may select one of the read retry operation on the selected page and the operation of setting a control time for a bit line coupled to the selected page. The memory device 100 may perform the operation selected by the read fail processor 230.

FIGS. 11A to 11D are diagrams illustrating a method of setting a bit line precharge time and a bit line evaluation time.

Referring to FIGS. 11A to 11D, respective figures illustrate the times of operations performed on a bit line when the memory device 100 performs a read operation. In detail, during the read operation, a bit line precharge operation of sensing the voltage or current of the bit line may be performed. Further, after the bit line precharge operation has been performed, a bit line evaluation operation of sensing change in the voltage or current of the bit line may be performed. Finally, a data latch operation of storing the result of the read operation through the bit line evaluation operation in a page buffer may be performed.

Figure 11A:
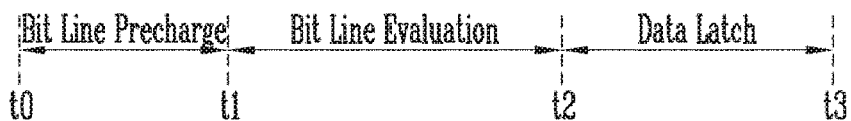
FIGS. 11A to 11D are diagrams illustrating a method of setting a bit line precharge time and a bit line evaluation time.

FIG. 11A illustrates respective times during which the bit line precharge operation, the bit line evaluation operation, and the data latch operation are performed. In detail, during an interval from t0 to t1, the bit line precharge operation may be performed. During an interval from t1 to t2, the bit line evaluation operation may be performed. During an interval from t2 to t3, the data latch operation may be performed.

Unless the bit line precharge time or the bit line evaluation time is sufficiently secured, error may occur during sensing of the voltage or current of the bit line. That is, the interval between bit line voltages for distinguishing a programmed state from an erased state or the interval between currents flowing through the bit line may be narrowed, thus causing error during the sensing procedure. Therefore, there is a need to sufficiently secure the bit line precharge time and the bit line evaluation time. Below, a method of setting a bit line precharge time and a bit line evaluation time will be described.

Figure 11B:

FIG. 11B illustrates a case where a bit line precharge time t0' to t1' is lengthened. In detail, FIG. 11B illustrates a bit line control time that is set when a read operation, performed by setting the bit line control time to the time illustrated in FIG. 11A, fails. In an embodiment, the bit line precharge time t0' to t1' may be set to a time longer than the bit line precharge time t0 to t1 illustrated in FIG. 11A. In this case, a bit line evaluation time t1' to t2' and a data latch time t2' to t3' may be identical to those illustrated in FIG. 11A.

Figure 11C:
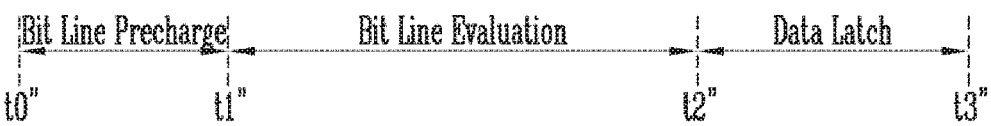

FIG. 11C illustrates a case where a bit line evaluation time t1" to t2" is lengthened. In detail, FIG. 11C illustrates a bit line control time that is set when a read operation, performed by setting the bit line control time to the time illustrated in FIG. 11A, fails. In an embodiment, the bit line evaluation time t1" to t2" may be set to a time longer than the bit line evaluation time t1 to t2 illustrated in FIG. 11A. In this case, a bit line precharge time t0" to t1" and a data latch time t2" to t3" may be identical to those illustrated in FIG. 11A.

Figure 11D:
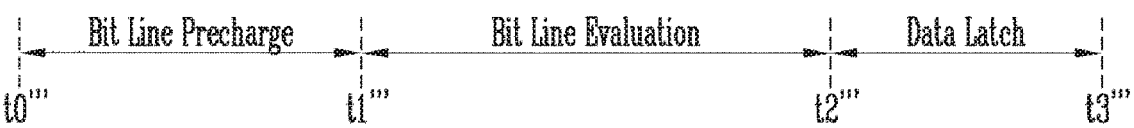

FIG. 11D illustrates a case where a bit line precharge time t0'" to t1'" and a bit line evaluation time t1'" to t2'" are lengthened. In detail, FIG. 11D illustrates a bit line control time that is set when a read operation, performed by setting the bit line control time to the time illustrated in FIG. 11A, fails. In an embodiment, the bit line precharge time t0'" to t1'" and the bit line evaluation time t1'" to t2'" may be set to longer times than the respective bit line precharge time t0 to t1 and the bit line evaluation time t1 to t2 illustrated in FIG. 11A. That is, FIG. 11D shows the control time obtained by combining the cases of FIGS. 11B and 11C. In this case, a data latch time t2'" to t3'" may be identical to that illustrated in FIG. 11A.

Figure 12:
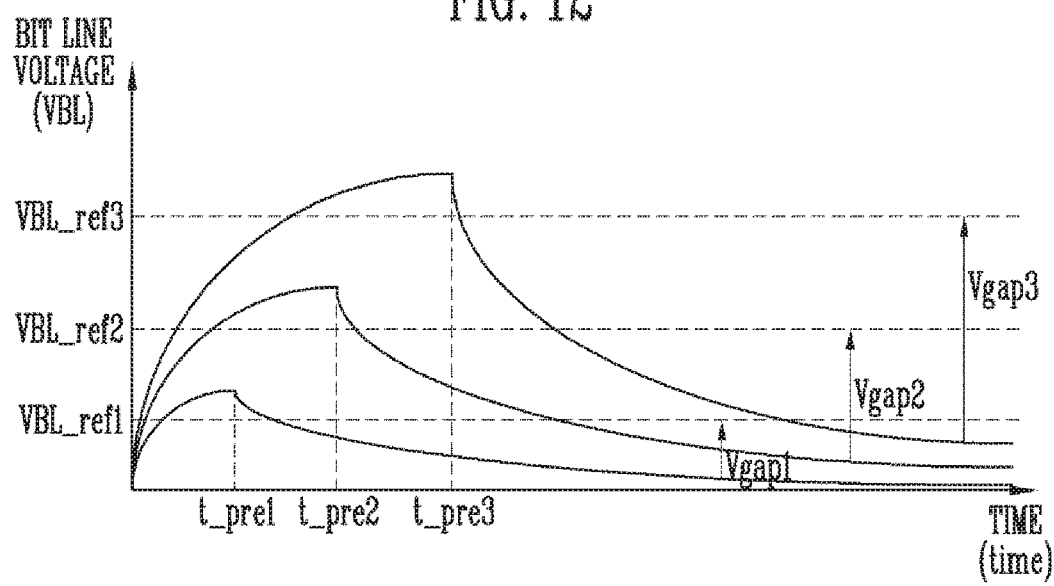
FIG. 12 is a diagram illustrating change in a bit line voltage depending on a bit line precharge time when the bit line precharge time is set.

FIG. 12 is a diagram illustrating change in a bit line voltage depending on a bit line precharge time when the bit line precharge time is set.

Referring to FIG. 12, the horizontal axis denotes change in time and the vertical axis denotes a bit line voltage VBL. FIG. 12 shows change in the voltage of a bit line coupled to an erased memory cell included in a selected page. That is, the bit line is coupled to the erased memory cell, and thus the bit line voltage decreases after being sensed depending on a read operation.

A bit line precharge time may be any of time t_pre1, time t_pre2, and time t_pre3, which are illustrated as being successively longer. When the bit line is precharged, the bit line voltage may increase. The change in the bit line voltage VBL may vary depending on the bit line precharge times t_pre1, t_pre2, and t_pre3.

A reference voltage for distinguishing an erased state from a programmed state may vary depending on the bit line precharge times t_pre1, t_pre2, and t_pre3. In detail, reference voltages VBL_ref1 to VBL_ref3 may increase as the bit line precharge time is lengthened. That is, as the bit line precharge time is lengthened, a difference between voltages for distinguishing the programmed state from the erased state may increase.

As the difference between the voltages for distinguishing the programmed state from the erased state becomes larger, that is, as the difference moves from Vgap1 to Vgap3, the programmed state and the erased state may be more definitely distinguished from each other. Therefore, as the bit line precharge time is lengthened, the probability that the read operation will pass may be increased.

In an embodiment, the bit line may be precharged for the first bit line precharge time t_pre1. In this case, the reference voltage for distinguishing the erased state from the programmed state may be the first reference voltage VBL_ref1. That is, when a read operation is performed on any one memory cell included in the selected page, a bit line coupled to the memory cell may be precharged for the first bit line precharge time t_pre1. When the bit line voltage becomes less than or equal to the first reference voltage VBL_ref1 after the first bit line precharge time t_pre1 has elapsed, the memory cell may be sensed as being in the erased state.

In an embodiment, the bit line may be precharged for the second bit line precharge time t_pre2. In this case, the reference voltage for distinguishing the erased state from the programmed state may be the second reference voltage VBL_ref2. That is, when a read operation is performed on any one memory cell included in the selected page, a bit line coupled to the memory cell may be precharged for the second bit line precharge time t_pre2. When the bit line voltage becomes less than or equal to the second reference voltage VBL_ref2 after the second bit line precharge time t_pre2 has elapsed, the memory cell may be sensed as being in the erased state.

In an embodiment, the bit line may be precharged for the third bit line precharge time t_pre3. In this case, the reference voltage for distinguishing the erased state from the programmed state may be the third reference voltage VBL_ref3. That is, when a read operation is performed on any one memory cell included in the selected page, a bit line coupled to the memory cell may be precharged for the third bit line precharge time t_pre3. When the bit line voltage becomes less than or equal to the third reference voltage VBL_ref3 after the third bit line precharge time t_pre3 has elapsed, the memory cell may be sensed as being in the erased state.

Figure 13:
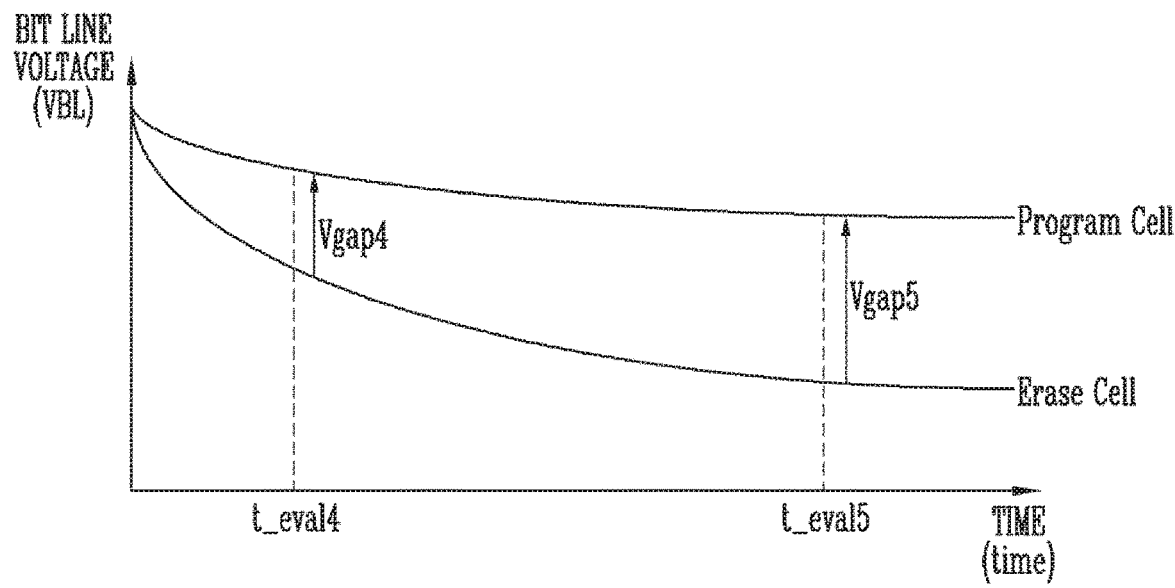
FIG. 13 is a diagram illustrating a method of performing a bit line evaluation operation based on the bit line voltage change of FIG. 12.

FIG. 13 is a diagram illustrating a method of performing a bit line evaluation operation based on the bit line voltage change of FIG. 12.

Referring to FIGS. 12 and 13, the horizontal axis denotes change in time and the vertical axis denotes a bit line voltage VBL. FIG. 13 illustrates change in the bit line voltage VBL to which any of the first to third bit line precharge times t_pre1 to t_pre3 are applied. In detail, FIG. 13 is a diagram illustrating the bit line voltage VBL in a time domain after a bit line precharge operation.

In an embodiment, in order to read memory cells included in a selected page, the memory device 100 may perform a bit line evaluation operation. By means of the bit line evaluation operation, each memory cell may be determined to be in a programmed state or in an erased state. A bit line evaluation time during which the bit line evaluation operation is performed may be a fourth or fifth bit line evaluation time t_eval4 or t_eval5.

In detail, when the bit line evaluation time is the fourth bit line evaluation time t_eval4, a difference between voltages for distinguishing the programmed state from the erased state may be Vgap4. Further, when the bit line evaluation time is the fifth bit line evaluation time t_eval5, the difference between voltages for distinguishing the programmed state from the erased state may be Vgap5.

When the bit line evaluation time is the fourth bit line evaluation time t_eval4, the read operation may fail. When the bit line evaluation time is the fourth bit line evaluation time t_eval4, the difference Vgap4 between the voltages for distinguishing the programmed state from the erased state may be small. That is, during the read operation, a read voltage may not fall within the range of the difference Vgap4 between the voltages for distinguishing the programmed state from the erased state. Therefore, during the read operation, when the bit line is evaluated for the fourth bit line evaluation time t_eval4, the read operation may fail.

When the bit line evaluation time is the fifth bit line evaluation time t_eval5, the read operation may pass. When the bit line evaluation time is the fifth bit line evaluation time t_eval5, the difference Vgap5 between voltages for distinguishing the programmed state from the erased state may be large. That is, during the read operation, a read voltage may fall within the range of the difference Vgap5 between the voltages for distinguishing the programmed state from the erased state. Therefore, during the read operation, when the bit line is evaluated for the fifth bit line evaluation time t_eval5, the read operation may pass.

In the differences between the voltages for distinguishing the programmed state from the erased state, Vgap5 may be greater than Vgap4. The larger the difference between the voltages for distinguishing the programmed state from the erased state, the higher the probability that the read operation will pass. Therefore, there is a need to secure a sufficient bit line evaluation time so that the read operation can pass.

Figure 14:
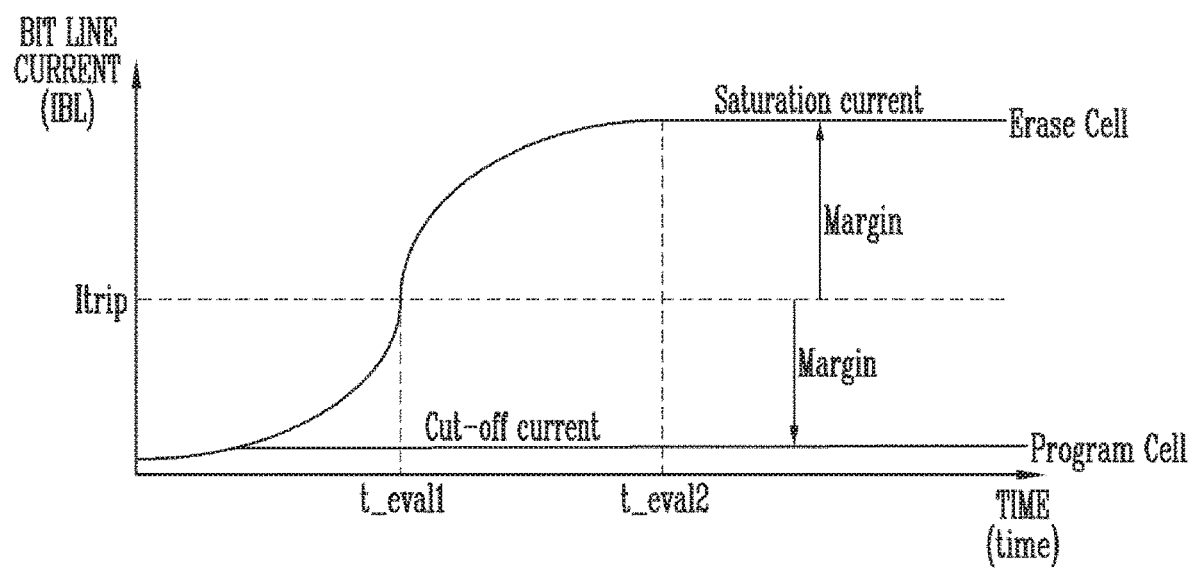
FIG. 14 is a diagram illustrating change in a bit line current depending on a bit line evaluation time.

FIG. 14 is a diagram illustrating change in a bit line current depending on a bit line evaluation time.

Referring to FIG. 14, the horizontal axis denotes change in time and the vertical axis denotes a bit line current IBL. In detail, FIG. 14 is a diagram illustrating change in the current of a bit line coupled to a memory cell included in a selected page. In detail, when the memory cell is in a programmed state (i.e., programmed cell or program cell), the bit line current IBL may not flow through the bit line or, alternatively, a cut-off current may flow through the bit line due to a small amount of charge. Alternatively, when the memory cell is in an erased state (i.e., erased cell or erase cell), the bit line current IBL flowing through the bit line may be a saturation current. In order to distinguish the states of the memory cells, the state of the memory cell may be determined by comparing a current sensed from the bit line with a reference current Itrip, which is obtained by calculating an arithmetic mean of the cut-off current and the saturation current, and by checking the difference the currents.

In an embodiment, the memory device 100 may perform a sensing operation for a first bit line evaluation time t_eval1. In detail, the memory device 100 may determine whether the bit line current IBL flowing through a bit line coupled to a memory cell included in a selected page is a cut-off current or a saturation current for the first bit line evaluation time t_eval1. Based on the bit line current IBL, the programmed state or the erased state of the memory cell may be determined.

The first bit line evaluation time t_eval1 may not be sufficient time to determine the state of the memory cell included in the selected page. That is, a margin by which a memory cell in the programmed state (i.e., programmed cell) is distinguished from a memory cell in the erased state (i.e., erased cell) may be small.

The result of bit line sensing performed for the first bit line evaluation time t_eval1 may include a bit error. That is, by means of the bit line evaluation operation performed for the first bit line evaluation time t_eval1, a memory cell in a programmed state may be determined to be in an erased state, or a memory cell in an erased state may be determined to be in a programmed state. Therefore, in order to secure a margin by which the memory cell in the programmed state (i.e., programmed cell) is distinguished from the memory cell in the erased state (i.e., erased cell), a sufficient bit line evaluation time may be secured. When the sufficient bit line evaluation time is secured, an accurate read operation may be performed.

In an embodiment, the memory device 100 may perform a sensing operation for a second bit line evaluation time t_eval2. The second bit line evaluation time t_eval2 may be a time sufficient to determine the state of the memory cell included in the selected page. That is, a margin by which a memory cell in a programmed state (i.e., programmed cell) is distinguished from a memory cell in an erased state (i.e., erased cell) may be large. Therefore, in order to secure a margin by which the memory cell in the programmed state (i.e., programmed cell) is distinguished from the memory cell in the erased state (i.e., erased cell), a sufficient bit line evaluation time may be secured. When the sufficient bit line evaluation time is secured, an accurate read operation may be performed.

Figure 15:
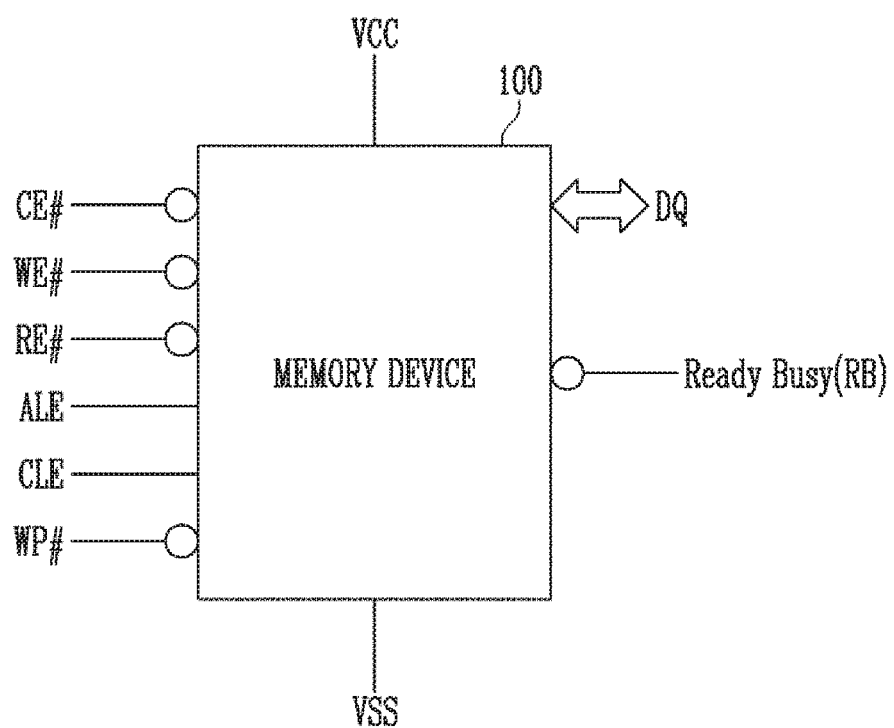
FIG. 15 is a diagram for explaining the pin configuration of a memory device, such as that of FIG. 1.

FIG. 15 is a diagram for explaining the pin configuration of the memory device of FIG. 1.

Referring to FIG. 15, the memory device 100 may communicate with an external controller through a plurality of input/output lines. For example, the memory device 100 may communicate with the external controller through control signal lines which include a chip enable line CE #, a write enable line WE #, a read enable line RE #, an address latch enable line ALE, a command latch enable line CLE, a write protect line WP #, and a ready/busy line RB, and data input/output lines DQ.

The memory device 100 may receive a chip enable signal from the external controller through the chip enable line CE #. The memory device 100 may receive a write enable signal from the external controller through the write enable line WE #. The memory device 100 may receive a read enable signal from the external controller through the read enable line RE #. The memory device 100 may receive an address latch enable signal from the external controller through the address latch enable line ALE. The memory device 100 may receive a command latch enable signal from the external controller through the command latch enable line CLE. The memory device 100 may receive a write protect signal from the external controller through the write protect line WP #.

In an embodiment, the memory device 100 may provide a ready/busy signal, indicating whether the memory device 100 is in a ready state or in a busy state, to the external controller through the ready/busy line RB.

The chip enable signal may be a control signal for selecting the memory device 100. When the chip enable signal is in a 'high' state and the memory device 100 is in a 'ready' state, the memory device 100 may enter a low-power standby state.

The write enable signal may be a control signal for performing control so that commands, addresses, and input data which are applied to the memory device are stored in a latch.

The read enable signal may be a control signal for enabling the output of serial data.

The address latch enable signal may be one of control signals used by the host so as to indicate which one of a command, an address, and data corresponds to the type of signal input to the input/output lines DQ.

The command latch enable signal may be one of control signals used by the host so as to indicate which one of a command, an address, and data corresponds to the type of signal input to the input/output lines DQ.

For example, when the command latch enable signal is activated (e.g., to a logic high state), the address latch enable signal is deactivated (e.g., to a logic low state), and the write enable signal is activated (e.g., to a logic low state) and then deactivated (e.g., to a logic high state), the memory device 100 may identify that the signal input through the input/output lines DQ is a command.

For example, when the command latch enable signal is deactivated (e.g., to a logic low state), the address latch enable signal is activated (e.g., to a logic high state), and the write enable signal is activated (e.g., to a logic low state) and then deactivated (e.g., to a logic high state), the memory device 100 may identify that the signal input through the input/output lines DQ is an address.

The write protect signal may be a control signal for deactivating the program operation and the erase operation that are performed by the memory device 100.

The ready/busy signal may be a signal for identifying the status of the memory device 100. That is, the ready/busy signal in a low state indicates that the memory device 100 is performing at least one operation. The ready/busy signal in a high state indicates that the memory device 100 is performing no operation.

Figure 16:
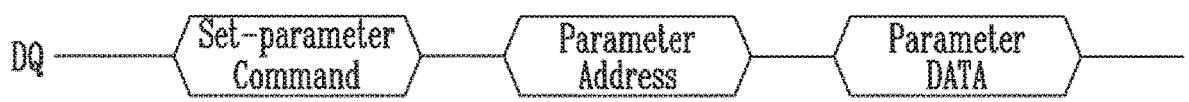
FIG. 16 is a diagram illustrating a method in which a memory controller changes a bit line precharge time or a bit line evaluation time of a memory device.

FIG. 16 is a diagram illustrating a method in which a memory controller changes a bit line precharge time or a bit line evaluation time of a memory device.

Referring to FIG. 16, the memory controller 200 may perform an operation of setting a bit line precharge time and a bit line evaluation time using a set-parameter command.

In detail, the memory controller 200 may provide a set-parameter command, a parameter address, and parameter data to the memory device 100 through input/output lines DQ.

The set-parameter command may be for performing control so that information about a bit line precharge time and a bit line evaluation time is stored in a specific register, among a plurality of registers included in the memory device 100.

The parameter address may be the address of a register in which data required in order to set the bit line precharge time and the bit line evaluation time is stored.

The parameter data may be used to set the bit line precharge time and the bit line evaluation time corresponding to bit line control data BLCTRL_DATA. The bit line control data BLCTRL_DATA may be provided by a read fail processor 230 to the memory device 100.

During a read operation, the memory device 100 may perform the read operation using the bit line precharge time and the bit line evaluation time stored at the parameter address.

Figure 17:
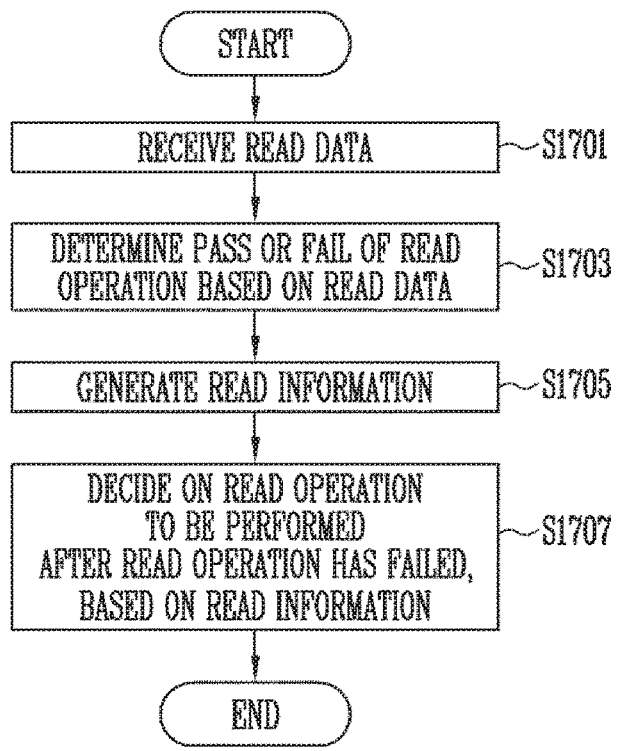
FIG. 17 is a flowchart illustrating the operation of a memory controller according to an embodiment of the present disclosure.

FIG. 17 is a flowchart illustrating the operation of a memory controller, e.g., memory controller 200, according to an embodiment of the present disclosure.

Referring to FIG. 17, at step S1701, the read operation controller 210 may receive read data READ_DATA from the memory device 100. The read data READ_DATA may be a result of a read operation performed to a selected page by the memory device 100 in response to a read command READ_CMD provided to the memory device 100. The read operation controller 210 may provide the read data READ_DATA to the read fail determiner 220.

At step S1703, the read fail determiner 220 may determine whether the read operation passed, i.e. or failed based on the read data READ_DATA. A pass of the read operation may represent that the read operation was successful. Also, a fail of the read operation may represent that the read operation failed. In detail, the read fail determiner 220 may determine that the read operation has failed when the number of memory cells, in which bit error occurs among a plurality of memory cells in the selected page, falls out of an error-correctable range. The read fail determiner 220 may determine that the read operation has passed when the number of memory cells in which bit error occurs fall within the error-correctable range.

At step S1705, the read fail determiner 220 may generate read information READ_INF including both the pass/fail result of the read operation (read operation determination result) and information about performance of the read operation (read operation performance information).

The read operation determination result may include information indicative of whether the read operation passed or failed. The read operation performance information may include information about the number of read retry operations performed due to the failure of the read operation and information about read voltages for performing the read operation.

In detail, when error included in the read data READ_DATA corresponding to the selected page falls out of a correctable range, the read fail determiner 220 may determine that the read operation has failed. In contrast, when error included in the read data READ_DATA corresponding to the selected page falls within the correctable range, the read fail determiner 220 may determine that the read operation has succeeded (passed).

The read fail determiner 220 may provide the read information READ_INF to the read fail processor 230.

At step S1707, the read fail processor 230 may decide on a read operation to be performed after the read operation has failed, based on the read information READ_INF.

In detail, the read operation determination result, included in the read information READ_INF, may include information indicating that the read operation has failed. When the read information READ_INF includes information indicating that the read operation has failed, the read fail processor 230 may decide on any one of a read retry operation to be performed on the selected page and an operation of setting a control time for a bit line coupled to the selected page, based on the read information READ_INF.

Figure 18:
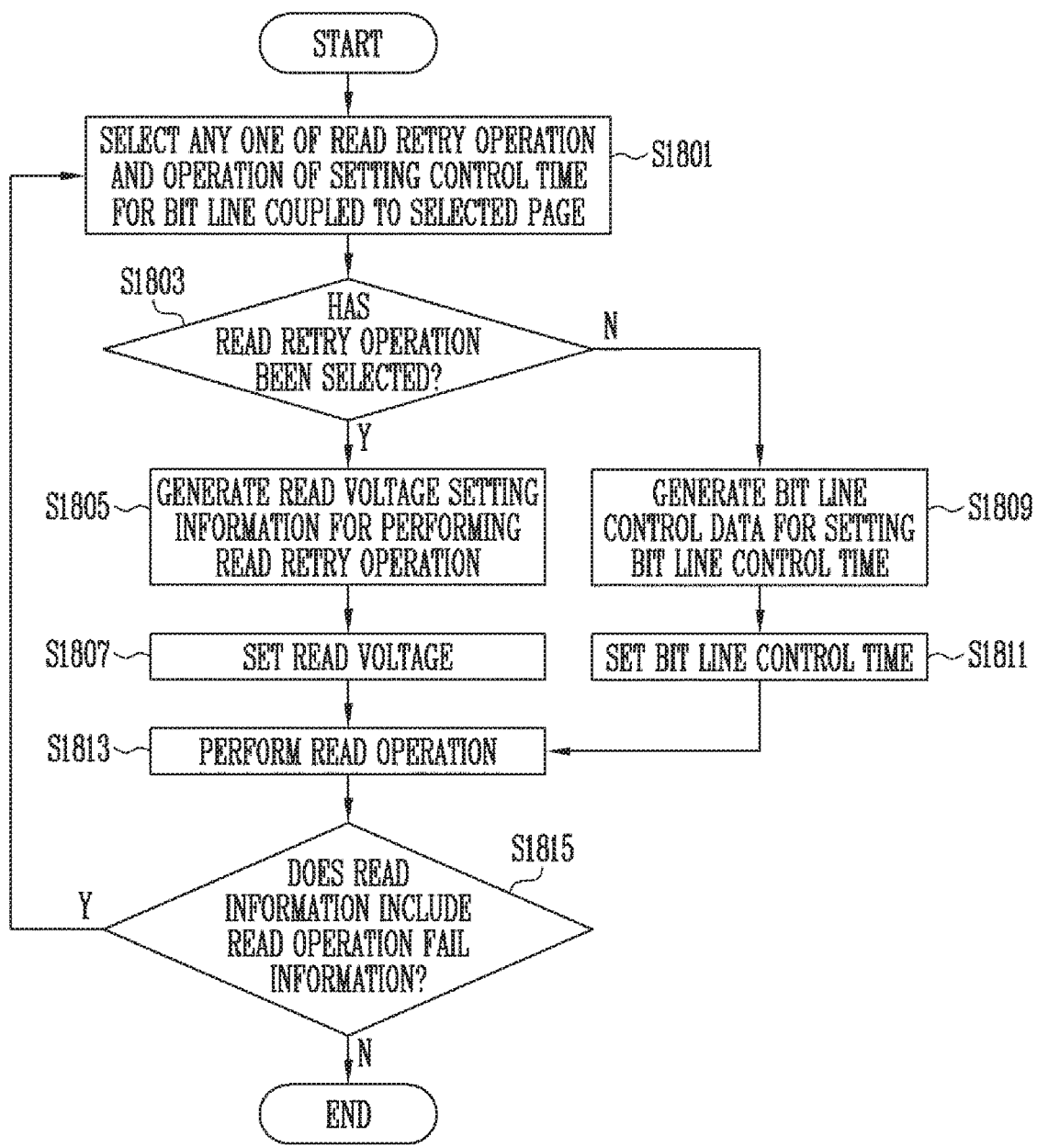
FIG. 18 is a flowchart illustrating the operation of a storage device according to an embodiment of the present disclosure.

FIG. 18 is a flowchart illustrating the operation of a storage device, e.g., storage device 50, according to an embodiment of the present disclosure.

Referring to FIG. 18, at step S1801, the read fail processor 230 may decide on a read operation to be performed after the read operation has failed, based on read information READ_INF. In detail, one of a read retry operation and an operation of setting a control time for a bit line coupled to the selected page may be selected.

In an embodiment, the read fail processor 230 may select one of the read retry operation on the selected page and the operation of setting the control time for the bit line coupled to the selected page, regardless of the previously performed read operation. Therefore, when the previously performed read operation fails, the memory device 100 may perform the read retry operation. Alternatively, when the previously performed read operation fails, the memory device 100 may set the control time for the bit line, and may then perform a read operation based on the set bit line control time.

At step S1803, whether the read fail processor 230 has selected the read retry operation may be determined. When the read fail processor 230 has selected the read retry operation (that is, "Y" at step S1803), the process proceeds to step S1805. When the read fail processor 230 has not selected the read retry operation (that is, "N" at step S1803), that is, when the operation of setting the control time for the bit line coupled to the selected page has been selected, the process proceeds to step S1809.

At step S1805, the read fail processor 230 may generate read voltage setting information VREAD_INF for performing the read retry operation based on the read information READ_INF. In detail, when the read operation decision component 231 included in the read fail processor 230 receives the read information READ_INF, the read operation decision component 231 may generate read retry information RRT_INF. The read retry information RRT_INF may include information about a previously performed read retry operation, among the read retry operations. The read operation decision component 231 may provide the read retry information RRT_INF to the read retry table 232.

The read retry table 232 may provide read voltage setting information VREAD_INF to the read operation controller 210 so as to perform one of the available read retry operations, that is, other than a previously performed read retry operation. The read voltage setting information VREAD_INF may include information about a read operation voltage required in order to perform a next read retry operation.

At step S1807, a read voltage for performing the next read retry operation may be set based on the read voltage setting information VREAD_INF. The set read voltage may be different from a read voltage used at the previously performed read retry operation.

At step S1809, the read fail processor 230 may generate bit line control data BLCTRL_DATA so as to set the control time for the bit line coupled to the selected page. In detail, when the read operation decision component 231 included in the read fail processor 230 receives the read information READ_INF, the read operation decision component 231 may generate bit line information BL_INF. The bit line information BL_INF may include information about a bit line precharge time and bit line evaluation time when the previously performed read operation fails. The read operation decision component 231 may provide the bit line information BL_INF to the bit line setting table 233.

The bit line setting table 233 may store information about a bit line precharge time and a bit line evaluation time that are to be applied during a next read operation.

The bit line setting table 233 may generate bit line control data BLCTRL_DATA such that a bit line precharge time and/or a bit line evaluation time are set to longer times than the respective bit line precharge time and/or bit line evaluation time included in the bit line information BL_INF. Data for setting the bit line precharge time and/or the bit line evaluation time included in the bit line control data BLCTRL_DATA may be data for setting an optimal time allowing the memory device 100 to pass the read operation.

The bit line setting table 233 may provide the bit line control data BLCTRL_DATA to the memory device 100.

At step S1809, the control time for the bit line may be set based on the bit line control data BLCTRL_DATA. In detail, the memory device 100 may set the bit line precharge time and/or the bit line evaluation time to longer times than a previous bit line precharge time and/or a previous bit line evaluation time respectively.

At step S1813, a read operation may be performed. In detail, a read retry operation may be performed after the read operation has failed. Alternatively, after the read operation has failed, the bit line precharge time and/or the bit line evaluation time may be set, after which the read operation may be performed again.

At step S1815, whether read information READ_INF about the read operation, performed after the previously performed read operation has failed, includes fail information may be determined. When the read information READ_INF includes fail information (that is, "Y" at step S1815), the process returns to step S1801. At step S1801, a read operation to be performed after the previously performed read operation has failed may be decided.

Figure 19:
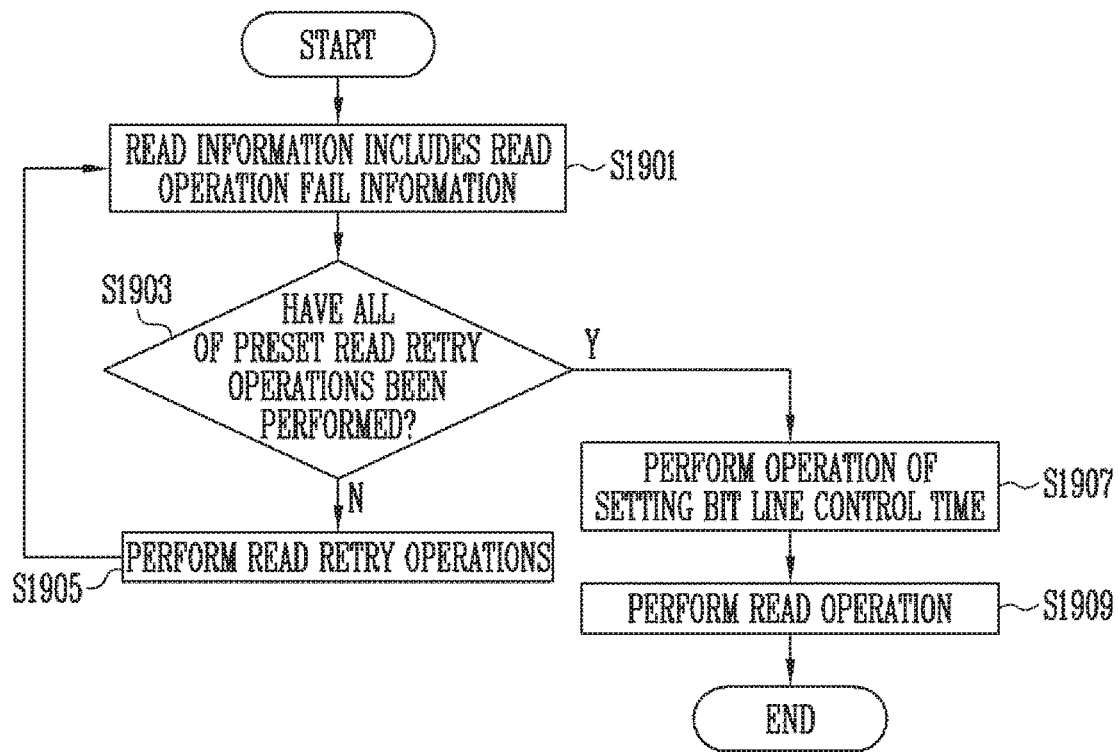
FIG. 19 is a flowchart illustrating the operation of a storage device according to an embodiment of the present disclosure.

FIG. 19 is a flowchart illustrating the operation of the storage device 50 according to an embodiment of the present disclosure.

Referring to FIG. 19, at step S1901, read information READ_INF may include information about failure of a read operation on a selected page. In detail, the read information READ_INF may include both a read operation determination result and read operation performance information. A read fail processor 230 may select one of a read retry operation on the selected page and an operation of setting a control time for a bit line coupled to the selected page, based on the read information READ_INF.

A read operation decision component 231 may select one of the read retry operation on the selected page and the operation of setting the control time for the bit line coupled to the selected page, based on a previously performed read operation.

In an embodiment, the read operation determination result may include read operation fail information, and the read operation performance information may include information indicating that not all available read retry operations have been performed. The available or preset read retry operations may be performed one-by-one according to their relative priorities immediately after the read operation has failed. The preset read retry operations may have priorities. When a present read retry operation fails, subsequent read retry operations may be performed in accordance with their relative priorities.

The priorities of the read retry operations may be determined according to a previously read voltage. The read retry operations are performed using read voltages gradually decreasing (or increasing) from the previously read voltage. That is, the priorities of the read retry operations may be a sequence of read operations performed with gradually decreasing read voltages. Moreover, the priorities of the read retry operations may be predetermined, and the priorities of the read retry operations may be not changed by the read retry operations.

At step S1903, whether all of the preset read retry operations have been performed may be determined. When all of the preset read retry operations have been performed (that is, "Y" at step S1903), the process proceeds to step S1907. When all of the preset read retry operations have not been performed (that is, "N" at step S1903), the process proceeds to step S1905.

At step S1905, among the preset read retry operations, read retry operations that are not yet been performed depending on the priorities thereof may be performed. After the read retry operations have been performed, the process returns to step S1901.

At step S1907, the operation of setting the control time for the bit line may be performed. The operation of setting the bit line control time may be performed when the read information READ_INF includes read operation fail information, even if all of the preset read retry operations have been performed. The operation of setting the bit line control time may include setting a bit line precharge time and a bit line evaluation time. The bit line precharge time and/or the bit line evaluation time may be sufficiently secured by setting the bit line control time.

At step S1909, the read operation may be performed based on the set bit line control time. When the bit line precharge time and/or the bit line evaluation time are sufficiently secured, a read operation to be subsequently performed may pass.

Figure 20:
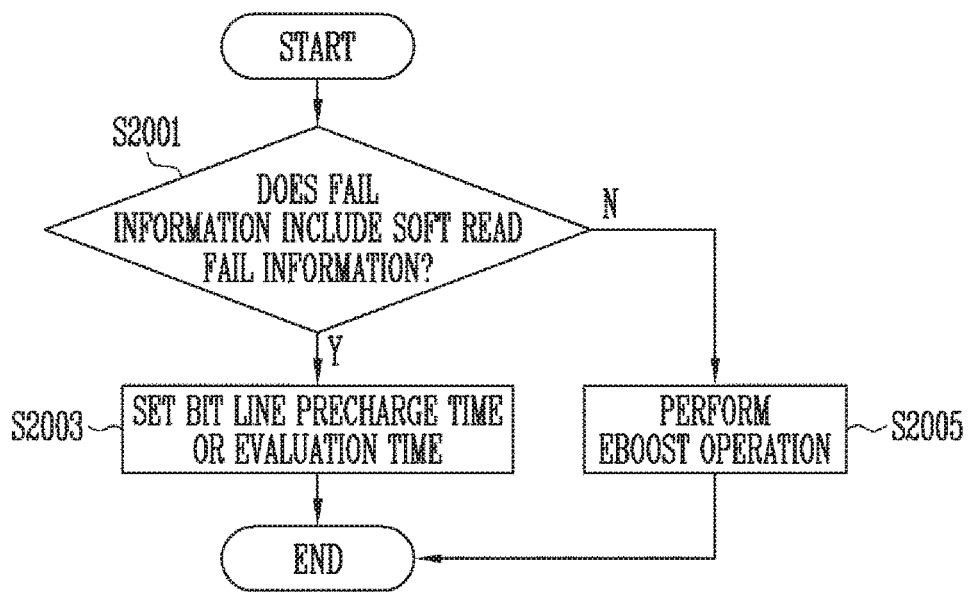
FIG. 20 is a flowchart illustrating the operation of a storage device according to an embodiment of the present disclosure.

FIG. 20 is a diagram illustrating the operation of a storage device according to an embodiment of the present disclosure.

Referring to FIG. 20, at step S2001, whether fail information includes soft read fail information may be determined. The soft read fail information may indicate failure of a soft read operation. When the fail information does include soft read fail information (that is, "Y" at step S2001), the process may proceed to step S2003. When the fail information does not include soft read fail information (that is "N" at step S2001), the process may proceed to step S2005.

In an embodiment, a plurality of memory cells coupled to a single word line may constitute a plurality of logical pages. In the case of multi-level cells, the plurality of logical pages may consist of an MSB page and an LSB page. The MSB page may store MSB data, and the LSB page may store LSB data.

Failure of the soft read operation may occur after a read operation on the MSB page has passed. For example, such failure may occur when the number of memory cells, in which an error has occurred, included in the LSB page falls out of an error-correctable range during a read operation of distinguishing programmed states of memory cells within the LSB page.

When the soft read operation fails, a read retry operation may be performed using a new read voltage or, alternatively, an operation of setting a control time for a bit line may be performed.

At step S2003, when the fail information includes soft read fail information, as the operation of setting the control time for the bit line, a bit line precharge time or a bit line evaluation time may be set. After the bit line precharge time or the bit line evaluation time has been set, a read operation may be performed again.

At step S2005, when the fail information does not include soft read fail information, an eBoost operation may be performed. When the fail information does not include soft read fail information, it may include hard read fail information that indicates that failure of a hard read operation. Failure of the hard read operation may occur when errors in memory cells included in the MSB page fall out of an error-correctable range during a read operation of distinguishing the programmed states of memory cells within the MSB page. When the hard read operation fails, the eBoost operation of correcting error may be performed. The eBoost operation may be an error-correction operation which detects a read voltage that minimizes the number of memory cells in which bit error occurs and which is performed after the read operation has been performed.

Figure 21:
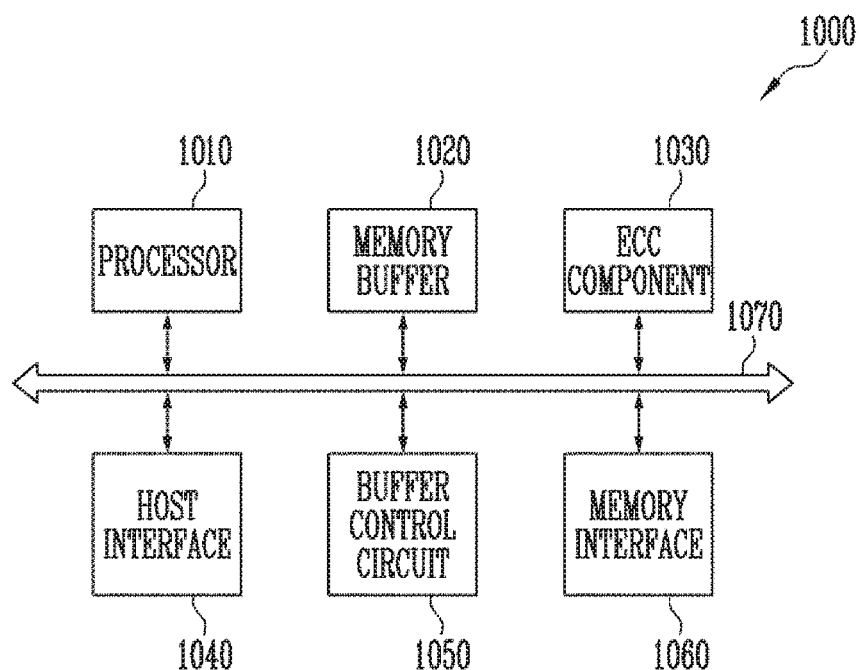
FIG. 21 is a diagram illustrating an embodiment of the memory controller of FIG. 1.

FIG. 21 is a diagram illustrating an embodiment of the memory controller of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 21, the memory controller 1000 may include a processor 1010, a memory buffer 1020, an error checking and correction (ECC) component 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical address (LA), provided by the host, into a physical address (PA) through the FTL. The FTL may receive the LA and translate the LA into the PA using mapping information. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC component 1030 may perform error correction including error correction code (ECC) encoding based on data to be written to the memory device through the memory interface 1060. The ECC-encoded data may be transferred to the memory device through the memory interface 1060. The ECC component 1030 may perform ECC decoding based on data received from the memory device through the memory interface 1060. In an example, the ECC component 1030 may be included as the component of the memory interface 1060 in the memory interface 1060.

The host interface 1040 may communicate with the external host under the control of the processor 1010. The host interface 1040 may perform communication using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may exchange commands, addresses, and data with the memory device through channels.

In an embodiment, the memory controller 1000 may not include the memory buffer 1020 and the buffer control circuit 1050. Either or both of these components may be provided separately from the memory controller 1000, or the functionality of either or both may be distributed within the controller 1000.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC component 1030, and the memory interface 1060. The control bus may be coupled to the host interface 1040, the processor 1010, the buffer control circuit 1050, the memory buffer 1020, and the memory interface 1060.

Figure 22:
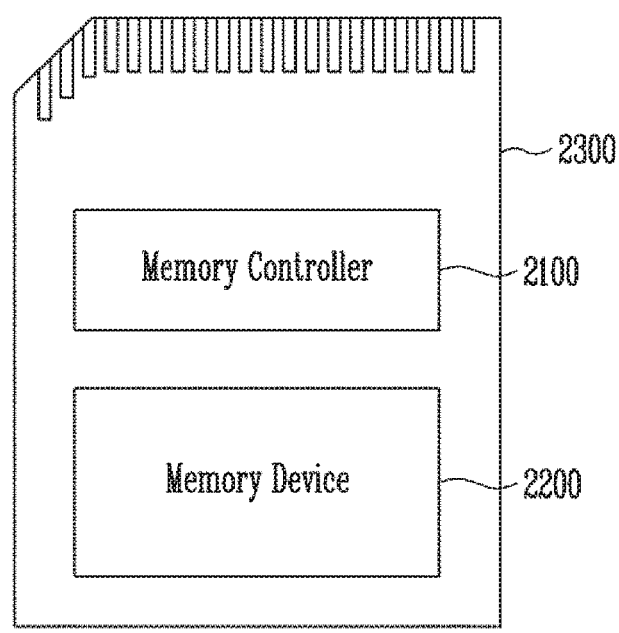
FIG. 22 is a block diagram illustrating a memory card system to which a storage device, according to an embodiment of the present disclosure, is applied.

FIG. 22 is a block diagram illustrating a memory card system to which the storage device, according to an embodiment of the present disclosure, is applied.

Referring to FIG. 22, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory device 2200 may be implemented in the same way as the memory device 100 described above with reference to FIG. 1.

In an embodiment, the memory controller 2100 may include components, such as a RAM, a processor, a host interface, a memory interface, and an ECC component.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The memory controller 2100 and the memory device 2200 may be integrated into a single semiconductor device to configure a memory card, such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 23:
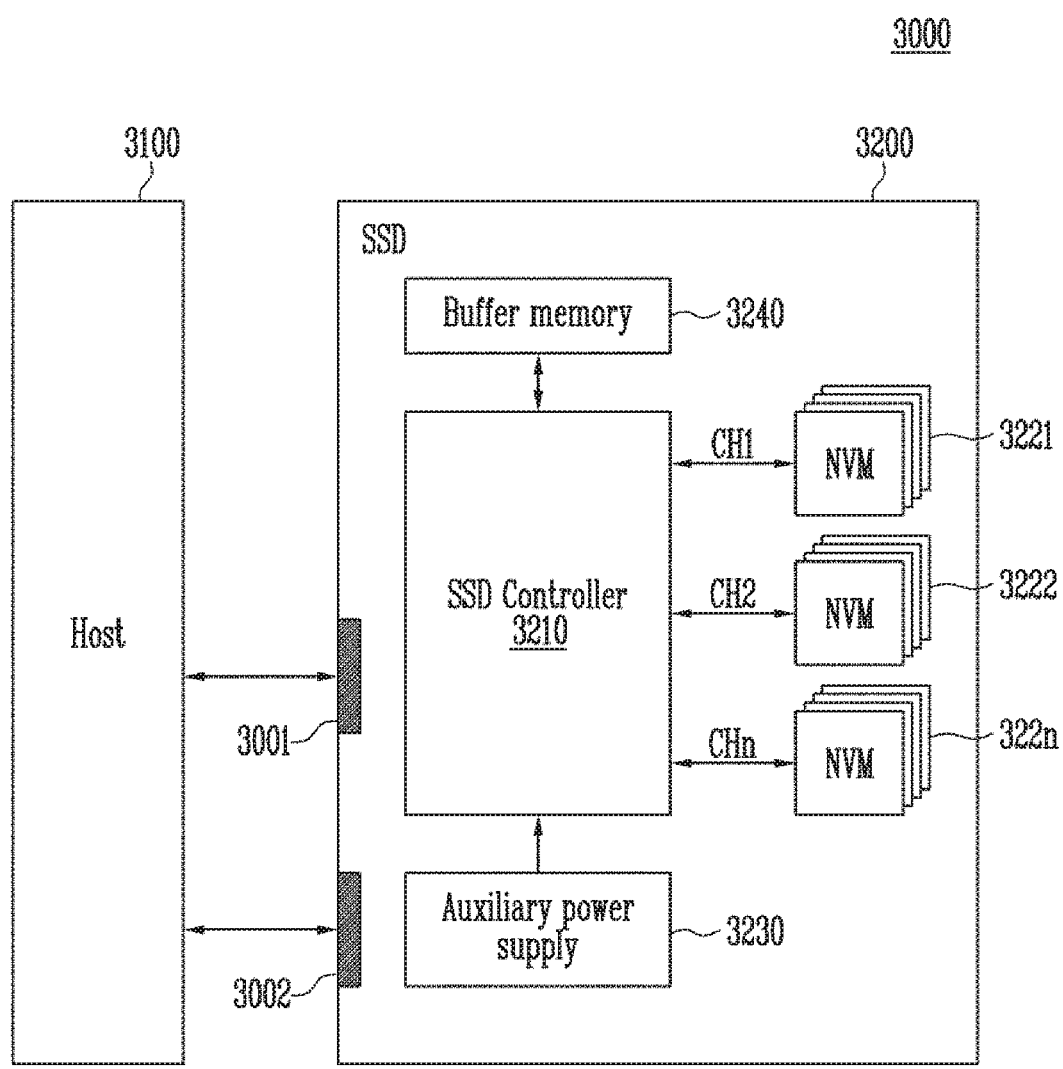
FIG. 23 is a block diagram illustrating an example of a solid state drive (SSD) system to which the storage device, according to an embodiment of the present disclosure, is applied.

FIG. 23 is a block diagram illustrating an example of a solid state drive (SSD) system to which the storage device according to an embodiment of the present disclosure is applied.

Referring to FIG. 23, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322$n$, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322$n$ in response to the signals SIG received from the host 3100. In an embodiment, the signals SIG may be based on the interfaces of the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322$n$ or may temporarily store metadata (e.g., mapping information) of the flash memories 3221 to 322$n$. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 24:
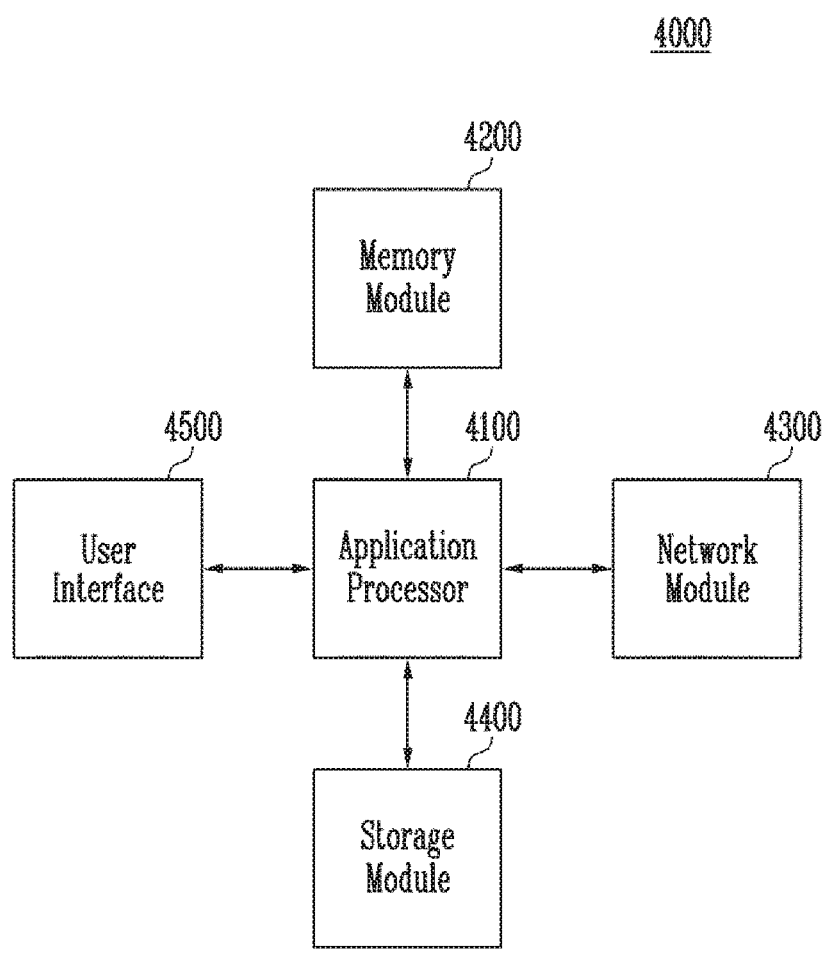
FIG. 24 is a block diagram illustrating a user system to which the storage device, according to an embodiment of the present disclosure, is applied.

FIG. 24 is a block diagram illustrating a user system to which the storage device, according to an embodiment of the present disclosure, is applied.

Referring to FIG. 24, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIGS. 5 to 7. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, a memory controller for processing the failure of a read operation and a method of operating the memory controller are provided.

While various embodiments of the present disclosure have been disclosed, those skilled in the art will appreciate that various modifications, additions and substitutions are possible without departing from the scope and spirit of the present disclosure. Therefore, the scope of the present invention is defined by the appended claims and equivalents thereof rather than by the description preceding them.

In the above-discussed embodiments, all steps may be selectively performed or skipped. In addition, the steps in each embodiment may not always be sequentially performed in given order, and instead may be performed in other suitable orders. Furthermore, the embodiments disclosed herein aim to help those skilled in this art more clearly understand the present disclosure rather than to limit the bounds of the present disclosure. In other words, one skilled in the art to which the present disclosure pertains will be able to easily understand that various modifications are possible based on the technical scope of the present disclosure.

In describing embodiments of the present disclosure specific terms or words are sometimes used. Such words should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A memory controller, comprising:
   a read operation controller configured to, when a read operation is performed on a page selected from among a plurality of pages included in a memory device, provide a read command to the memory device and receive read data corresponding to the read command;
   a read fail determiner configured to determine, based on the read data, whether the read operation has passed or failed, and to generate read information including a result of the read operation and information about performance of the read operation; and
   a read fail processor configured to select, based on the read information, a read retry operation to be performed on the selected page or an operation of setting a control time for a bit line coupled to the selected page, and to control the memory device to perform the selected operation.

2. The memory controller according to claim 1, wherein the read fail determiner generates the read information in which information indicating failure of the read operation is included in the result of the read operation when an error in the read data falls out of a correctable range.

3. The memory controller according to claim 2, wherein the read fail processor comprises a read retry table configured to include information on a plurality of read retry operations and a bit line setting table configured to include information on the operation of setting the control time for the bit line.

4. The memory controller according to claim 3, wherein the read retry table includes a plurality of pieces of read retry operation information for the plurality of read retry operations, respectively.

5. The memory controller according to claim 4, wherein the read fail processor is configured to:
   select one of the plurality of pieces of read retry operation information and control the memory device to perform a corresponding read retry operation, when the result of the read operation includes the information indicating failure of the read operation, and
   when the information about performance of the read operation includes information indicating that not all of the plurality of read retry operations have been performed.

6. The memory controller according to claim 4, wherein the read retry table is configured such that the plurality of pieces of read retry operation information include respective read voltages at different levels for the read retry operations.

7. The memory controller according to claim 6, wherein the read fail processor selects one piece of read retry operation information, from among the plurality of pieces of read retry operation information, so as to perform a corresponding read retry operation, generates read voltage setting information for determining a read voltage corresponding to the selected piece of read retry operation information, and provides the generated read voltage setting information to the read operation controller.

8. The memory controller according to claim 7, wherein the read operation controller provides the read command to the memory device so that the memory device performs the read retry operation corresponding to the selected piece of read retry operation information, and receives read data responding to the read command.

9. The memory controller according to claim 4, wherein the read fail processor is configured to:
   perform a read operation on a Most Significant Bit (MSB) logical page in which MSB data is stored, among logical pages in the selected page, and a read operation on a Least Significant Bit (LSB) logical page in which LSB data is stored, among the logical pages, when the result of the read operation indicates failure of the read operation, and
   when the information about performance of the read operation includes information indicating that all of the read retry operations have been performed.

10. The memory controller according to claim 9, wherein the read fail processor is configured to, when the read operation on the MSB logical page has passed and the read operation on the LSB logical page has failed, generate bit line control data for performing the operation of setting the control time for the bit line.

11. A method of operating a memory controller, the method comprising:
   providing a read command to a memory device when a read operation is performed on a page selected from among a plurality of pages included in the memory device;
   receiving read data corresponding to the read command;
   determining, based on the read data, whether the read operation has passed or failed;
   generating read information including a result of the read operation and information about performance of the read operation; and
   selecting, based on the read information, a read retry operation to be performed on the selected page or an operation of setting a control time for a bit line coupled to the selected page.

12. The method according to claim 11, wherein generating the read information comprises generating information indicating failure of the read operation which is included in the result of the read operation when an error included in the read data corresponding to the selected page falls out of a correctable range.

13. The method according to claim 12, wherein the selecting comprises:
   selecting one of a plurality of pieces of read retry operation information and controlling the memory device to perform the read retry operation corresponding to the selected piece of read retry operation information,
   when the result of the read operation includes the information indicating failure of the read operation, and
   when the information about performance of the read operation includes information indicating that not all of read retry operations have been performed.

14. The method according to claim 13, wherein the plurality of pieces of read retry operation information include respective read voltages at different levels for the read retry operations.

15. The method according to claim 14, wherein the selecting comprises repeatedly selecting respective pieces of read retry operation information, one at a time, from among the plurality of pieces of read retry operation information, until all of the read retry operations are performed.

16. The method according to claim 14, wherein the selecting comprises:
   selecting the one of the plurality of pieces of read retry operation information and selecting the read voltage corresponding to the selected piece of read retry operation information; and
   providing the read command to the memory device so as to perform a read operation using the selected read voltage.

17. The method according to claim 13, wherein the selecting comprises:
   performing a read operation on a Most Significant Bit (MSB) logical page in which MSB data is stored, among logical pages in the selected page, and a read operation on a Least Significant Bit (LSB) logical page in which LSB data is stored, among the logical pages,
   when the result of the read operation includes the information indicating failure of the read operation, and
   when the information about performance of the read operation includes information indicating that all of the read retry operations have been performed.

18. The method according to claim 17, wherein the selecting comprises:
   generating, when the read operation on the MSB page has passed and the read operation on the LSB page has failed, bit line control data that allows the memory device to perform the operation of setting the control time for the bit line.

19. A method of operating a storage device, the method comprising:
   determining whether a read operation on a selected page has passed or failed when the read operation is performed on the selected page from among a plurality of pages included in a memory device;
   selecting, when the read operation fails, a read retry operation on the selected page or a read operation on the selected page performed after a control time for a bit line coupled to the selected page has been set.

20. The method according to claim 19, further comprising: performing, when the selected operation fails, a read operation by selecting one of the read retry operation on the selected page and a read operation on the selected page to be performed after the control time for the bit line coupled to the selected page has been set.

* * * * *